(12) United States Patent
Kwon et al.

(10) Patent No.: US 9,214,441 B2
(45) Date of Patent: Dec. 15, 2015

(54) SEMICONDUCTOR PACKAGE INCLUDING STACKED MEMORY CHIPS

(71) Applicants: Heungkyu Kwon, Seongnam-si (KR); Kyoungmook Lim, Hwaseong-si (KR)

(72) Inventors: Heungkyu Kwon, Seongnam-si (KR); Kyoungmook Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/283,833

(22) Filed: May 21, 2014

(65) Prior Publication Data

US 2015/0048521 A1 Feb. 19, 2015

(30) Foreign Application Priority Data

Aug. 16, 2013 (KR) ........................ 10-2013-0097341

(51) Int. Cl.
| | | |
|---|---|---|
| *H01L 23/48* | (2006.01) | |
| *H01L 23/00* | (2006.01) | |
| *H01L 25/065* | (2006.01) | |
| *H01L 25/10* | (2006.01) | |

(52) U.S. Cl.
CPC ............ *H01L 24/30* (2013.01); *H01L 25/0652* (2013.01); *H01L 25/105* (2013.01); *H01L 2224/16225* (2013.01); *H01L 2224/3001* (2013.01); *H01L 2224/32145* (2013.01); *H01L 2224/32225* (2013.01); *H01L 2224/48091* (2013.01); *H01L 2224/48137* (2013.01); *H01L 2224/48227* (2013.01); *H01L 2224/73204* (2013.01); *H01L 2224/73265* (2013.01); *H01L 2225/0651* (2013.01); *H01L 2225/06506* (2013.01); *H01L 2225/1023* (2013.01); *H01L 2225/1058* (2013.01); *H01L 2924/15192* (2013.01); *H01L 2924/15311* (2013.01); *H01L 2924/15331* (2013.01)

(58) Field of Classification Search
CPC ........... H01L 2224/48227; H01L 2224/32145; H01L 2224/48137; H01L 25/0657
See application file for complete search history.

(56) References Cited

U.S. PATENT DOCUMENTS

| | | | |
|---|---|---|---|
| 6,472,747 B2 | 10/2002 | Bazarjani et al. | |
| 7,009,303 B2 | 3/2006 | Kuroda et al. | |
| 7,061,785 B2 | 6/2006 | Miwa et al. | |
| 7,622,799 B2 | 11/2009 | Kuroda et al. | |
| 7,751,264 B1 * | 7/2010 | Wu et al. | ....................... 365/200 |
| 8,399,966 B2 | 3/2013 | James | |

(Continued)

FOREIGN PATENT DOCUMENTS

| | | |
|---|---|---|
| JP | 2005228932 A | 8/2005 |
| KR | 100390466 B1 | 7/2003 |

*Primary Examiner* — John C Ingham
(74) *Attorney, Agent, or Firm* — Harness, Dickey, & Pierce, P.L.C.

(57) ABSTRACT

According to example embodiments, a semiconductor package includes a first and a second semiconductor package. The first semiconductor package includes a first package substrate, first and second memory chips spaced apart from each other on the first package substrate in a first direction, third and fourth memory chips on the first and second memory chips, respectively, and first and second jumper chips on the first and second memory chips, respectively. The first and second jumper chips are spaced apart from the third and fourth memory chips, respectively, in a second direction crossing the first direction. The second semiconductor package may include a second package substrate and a logic chip on the second package substrate. The first semiconductor package may be on the second semiconductor package.

20 Claims, 20 Drawing Sheets

(56) References Cited

U.S. PATENT DOCUMENTS

| | | |
|---|---|---|
| 2002/0121679 A1 | 9/2002 | Bazarjani et al. |
| 2004/0027869 A1 | 2/2004 | Miwa et al. |
| 2005/0104183 A1 | 5/2005 | Kuroda et al. |
| 2006/0051912 A1* | 3/2006 | Chan .................. 438/166 |
| 2007/0170573 A1 | 7/2007 | Kuroda et al. |
| 2009/0289265 A1 | 11/2009 | Roozeboom et al. |
| 2010/0148349 A1* | 6/2010 | Kim et al. ............... 257/690 |
| 2011/0018129 A1 | 1/2011 | Suzuki et al. |
| 2011/0298129 A1* | 12/2011 | Hong ..................... 257/738 |
| 2011/0309454 A1 | 12/2011 | Ho et al. |
| 2012/0068229 A1* | 3/2012 | Bemanian et al. ......... 257/209 |
| 2012/0199960 A1 | 8/2012 | Cosue et al. |
| 2012/0235286 A1 | 9/2012 | James |

* cited by examiner

SEMICONDUCTOR PACKAGE INCLUDING STACKED MEMORY CHIPS

CROSS-REFERENCE TO RELATED APPLICATIONS

This U.S. non-provisional patent application claims priority under 35 U.S.C. §119 to Korean Patent Application No. 10-2013-0097341, filed on Aug. 16, 2013, in the Korean Intellectual Property Office, the entire contents of which are hereby incorporated by reference.

BACKGROUND

Example embodiments of inventive concepts relate to a semiconductor package, and in particular, to a semiconductor package including memory chips, whose memory capacities are different from each other.

Recently, demand for a single system with a plurality of processors or a multicore processor system has increased in order to implement higher performing and/or more efficient portable electronic applications, such as a portable multimedia player (PMP), a mobile phone, a smart phone, a global positioning system (GPS), a navigation system, a digital camera, a digital video camera, or a personal digital assistant (PDA).

For example, demand has increased for mobile phones with additional functions such as playing music, playing movies, playing games, taking pictures, making payments, in addition to the basic phone function. Accordingly, there is a desire to integrate not only a communication processor, which may be configured to perform communication modulation and demodulation, but also a media processor, which may be configured to perform application functions, except the communication function, on a printed circuit board in the mobile phone. This may be achieved by methods of stacking a plurality of semiconductor chips in a package or stacking one package on another package. For example, in a package-on-package (PoP) structure, one of the stacked packages may include a plurality of semiconductor chips. In this case, since the plurality of the semiconductor chips should be electrically connected to each other within one package, a wiring structure of the device may become more complex. As a result, the device may suffer from decreased routability.

Further, since a memory device with a large capacity may be desired in a multi-processing system, the use of a multi-chip package structure including a plurality of memory chips may be desired.

SUMMARY

Example embodiments of inventive concepts relate to a semiconductor package including a plurality of memory chips with different memory capacities and thereby having an increased memory capacity.

Example embodiments of inventive concepts relate to a semiconductor package having a pad arrangement structure capable of improving routability and a package property.

According to example embodiments of inventive concepts, a semiconductor package may include a first semiconductor package and a second semiconductor package. The first semiconductor package may be on the second semiconductor package. The first semiconductor package may include: a first package substrate; first and second memory chips on the first package substrate, the first and second memory chips spaced apart from each other in a first direction; third and fourth memory chips on the first and second memory chips, respectively; and first and second jumper chips on the first and second memory chips, respectively. The second semiconductor package may include a second package substrate and a logic chip on the second package substrate. The first and second jumper chips may be spaced apart from the third and fourth memory chips, respectively, in a second direction crossing the first direction.

In example embodiments, the first package substrate may include first and second edges facing each other. Each of the first to fourth memory chips may include memory data pads and memory command/address pads, which are electrically connected to the logic chip. The memory data pads and the memory command/address pads in each of the first to fourth memory chips, respectively, may be spaced apart from each other in the second direction. The memory data pads and the memory command/address pads in each of the first to fourth memory chips, respectively, may be arranged parallel to the first edge.

In example embodiments, the second package substrate may include first DQ coupling pads, second DQ coupling pads, first CA coupling pads, and second CA coupling pads. The first DQ coupling pads and the first CA coupling pads may face each other and may be electrically connected to the first and third memory chips. The second DQ coupling pads and the second CA coupling pads may face each other and may be electrically connected to the second and fourth memory chips. When viewed in a plan view, the first and second DQ coupling pads may be adjacent to the memory data pads of the first to fourth memory chips, and the first and second CA coupling pads may be adjacent to the memory command/address pads of the first to fourth memory chips.

In example embodiments, the logic chip may include first data pads, second data pads, first command/address pads, and second command/address pads. The first data pads and the first command/address pads may be electrically connected to the first and third memory chips. The first data pads and the first command/address pads may face each other. The second data pads and the second command/address pads may be electrically connected to the second and fourth memory chips. The second data pads and the second command/address pads may face each other. The first and second data pads may be adjacent to the first and second DQ coupling pads, respectively, and the first and second command/address pads may be adjacent to the first and second CA coupling pads, respectively.

In example embodiments, the logic chip may include first data pads, second data pads, first command/address pads, second command/address pads, a first side surface, and a second side surface. The first data pads and the first command/address pads may be electrically connected to the first and third memory chips. The first data pads and the first command/address pads may face each other. The second data pads and the second command/address pads may be electrically connected to the second and fourth memory chips. The second data pads and the second command/address pads may face each other. The first and second side surfaces may be adjacent to each other. The first data pads may be adjacent to the first side surface, and the second data pads may be adjacent to the second side surface. When viewed in a plan view, the second data pads may be adjacent to the memory data pads of the first to fourth memory chips.

In example embodiments, the second package substrate may include first to fourth DQ coupling pads, first CA coupling pads, and second CA coupling pads along one side surface of the second package substrate. The first DQ coupling pads, the second DQ coupling pads, and the first CA coupling pads may be electrically connected to the first and third memory chips. The third DQ coupling pads, the fourth DQ coupling pads, and the second CA coupling pads may be electrically connected to the second and fourth memory chips. The first CA coupling pads may be between the first and second DQ coupling pads, and the second CA coupling pads may be between the third and fourth DQ coupling pads.

In example embodiments, the logic chip may include first to fourth data pads, first command/address pads, and second command/address pads along one side surface of the logic chip. The first data pads, the second data pads, and the first command/address pads may be electrically connected to the first and third memory chips. The third data pads, the fourth data pads, and the second command/address pads may be electrically connected to the second and fourth memory chips. The first to fourth data pads may be adjacent to the first to fourth DQ coupling pads, respectively, and the first and second command/address pads may be adjacent to the first and second CA coupling pads, respectively.

In example embodiments, each of the first to fourth memory chips may include first to fourth memory data pads, first memory command/address pads, and second memory command/address pads. The first memory data pads, the second memory data pads, and the first memory command/address pads may be adjacent to a side of the semiconductor package. The third memory data pads, the fourth memory data pads, and the second memory command/address pads may be adjacent to an opposite side of the semiconductor package. The first memory command/address pads may be between the first and second memory data pads, and the second memory command/address pads may be between the third and fourth memory data pads.

In example embodiments, the second package substrate may include first to eighth DQ coupling pads, and first to fourth CA coupling pads. The first to fourth DQ coupling pads, the first CA coupling pads, and the second CA coupling pads may be electrically connected to the first and third memory chips. The fifth to eighth DQ coupling pads, the third CA coupling pads, and the fourth CA coupling pads may be electrically connected to the second and fourth memory chips. When viewed in a plan view, the first DQ coupling pads, the second DQ coupling pads, and the first CA coupling pads may be adjacent to the first memory data pads, the second memory data pads, and the first memory command/address pads, respectively, of the first memory chip. When viewed in the plan view, the third DQ coupling pads, the fourth DQ coupling pads, and the second CA coupling pads may be adjacent to the third memory data pads, the fourth memory data pads, and the second memory command/address pads, respectively, of the first memory chip. When viewed in the plan view, the fifth DQ coupling pads, the sixth DQ coupling pads, and the third CA coupling pads may be adjacent to the first memory data pads, the second memory data pads, and the first memory command/address pads, respectively, of the second memory chip. When viewed in the plan view, the seventh DQ coupling pads, the eighth DQ coupling pads, and the fourth CA coupling pads may be adjacent to the third memory data pads, the fourth memory data pads, and the second memory command/address pads, respectively, of the second memory chip.

In example embodiments, the logic chip may include first to eighth data pads, and first to fourth command/address pads. The first to the fourth data pads, the first command/address pads, and the second command/address pads may be electrically connected to the first and third memory chips. The fifth to the eighth data pads, the third command/address pads, and the fourth command/address pads may be electrically connected to the second and fourth memory chips. The first to eighth data pads may be adjacent to the first to eighth DQ coupling pads, respectively, and the first to fourth command/address pads may be adjacent to the first to fourth CA coupling pads, respectively.

In example embodiments, the logic chip may include first to eight data pads, first to fourth command/address pads, and first to fourth side surfaces. The first to fourth data pads, the first command/address pads, and second command/address pads may be connected to the first and third memory chips. The fifth to eighth data pads, the third command/address pads and the fourth command/address pads may be connected to the second and fourth memory chips. The first and second side surfaces of the logic chip may be adjacent to each other, and the third and fourth side surfaces of the logic chip may face the first and second side surfaces, respectively, of the logic chip. The first data pads, the second data pads, and the first command/address pads may be adjacent to the first side surface of the logic chip. The third data pads, the fourth data pads, and the second command/address pads may be adjacent to the second side surface of the logic chip. The fifth data pads, the sixth data pads, and the third command/address pads may be adjacent to the third side surface of the logic chip. The seventh data pads, the eighth data pads, and the fourth command/address pads may be adjacent to the fourth side surface of the logic chip.

In example embodiments, the semiconductor package may further include wires. Each of the first and second jumper chips may include first and second wire bonding pads spaced apart from each other in the second direction. The first and second wire bonding pads may be arranged along the first direction. The first wire bonding pads may be connected to the third and fourth memory chips through the wires.

In example embodiments, a memory capacity of each of the first and second memory chips has a memory capacity may be twice a memory capacity of each of the third and fourth memory chips.

According to example embodiments of inventive concepts, a semiconductor package may include: a package substrate, a logic chip on the package substrate, first and second memory chips on the package substrate, third and fourth memory chips on the first and second semiconductor chips, respectively, and first and second jumper chips on the first and second semiconductor chips, respectively. The first and second memory chips may be electrically connected to the logic chip. The first and second memory chips may be spaced apart from the logic chip in a first direction. The first and second memory chips may be spaced apart from each other in a second direction crossing the first direction. The third and fourth memory chips may be electrically connected to the logic chip. A memory capacity of the first and second memory chips may be twice a memory capacity of the third and fourth memory chips. The first and second jumper chips may be spaced apart from the third and fourth memory chips, respectively, in the first direction.

In example embodiments, the semiconductor package may include wires. The logic chip may include first to fourth data pads, first command/address pads, and second command/address pads along one side surface of the logic chip. The first command/address pads may be between the first and second data pads, and the second command/address pads may be between the third and fourth data pads. Each of the first to fourth memory chips may include memory data pads and memory command/address pads spaced apart from each other in the first direction. The memory data pads may be arranged along and adjacent to the one side surface of the logic chip. Each of the first and second jumper chips may include first wire bonding pads and second wire bonding pads spaced apart from each other in the first direction, and the first and second wire bonding pads may be arranged parallel to the memory data pads. The first wire bonding pads may be connected to the third and fourth memory chips through the wires.

According to example embodiments, a semiconductor package includes: a first substrate; a logic chip on the first substrate; a second substrate on the logic chip; first memory chips spaced apart from each other in a first direction on the second substrate; second memory chips on the first memory chips; and jumper chips on the first memory chips. The logic chip includes a first number of data pads and a second number of communication pads. The first memory chips include a first quantity of first memory data pads and a second quantity of first memory command/address pads, which are electrically connected to the logic chip. The second memory chips include a third quantity of second memory data pads and a fourth quantity of second memory command/address pads, which are electrically connected to the logic chip. The jumper chips are spaced apart from the second memory chips in a second direction crossing the first direction. The jumper chips include a fifth quantity of first wire bonds pads and second wire bond pads, respectively, which are electrically connected to the logic chip.

In example embodiments, a number of the first memory chips may be equal to a number of the second memory chips, a number of the jumper chips may be equal to the number of first memory chips, and a memory capacity of the first memory chips may be greater than a memory capacity of the second memory chips.

In example embodiments, the data pads and the communication pads in the logic chip may not be on at least one same side of the logic chip.

In example embodiments, a portion of the data pads and a portion of the communication pads may be arranged on at least one same side of the logic chip.

In example embodiments, the first memory data pads and the first memory command/address pads may not be on a same side of the first memory chips, and a the second memory data pads and the second memory command/address pads may not be on a same side of the second memory chips.

BRIEF DESCRIPTION OF THE DRAWINGS

Example embodiments will be more clearly understood from the following brief description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

Figure 1:
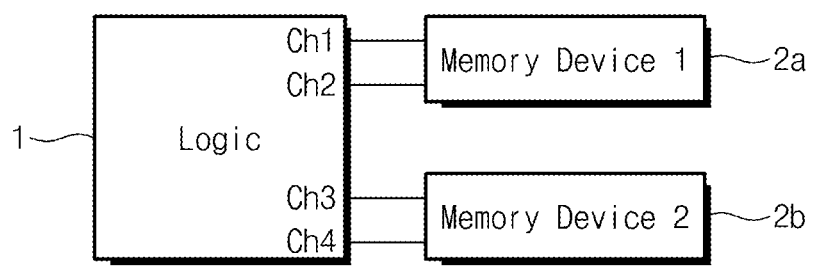
FIG. 1 is a schematic block diagram illustrating a semiconductor package according to example embodiments of inventive concepts.

It should be noted that these figures are intended to illustrate the general characteristics of methods, structure and/or materials utilized in certain example embodiments of inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments of inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which so example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic block diagram illustrating a semiconductor package according to example embodiments of inventive concepts.

Referring to FIG. 1, a semiconductor package may include a logic device 1 and a plurality of memory devices (e.g., first to second memory devices 2a and 2b). In example embodiments, the logic device 1 and the memory devices 2a and 2b may be individual semiconductor chips.

The logic device 1 may be, for example, a photoelectron device, a communication device, a digital signal processor, a controller, or a system-on-chip. In example embodiments of inventive concepts, the logic device 1 may be a digital baseband modem processor and/or an analog baseband modem processor. In example embodiments of inventive concepts, the logic device 1 may be a media processor, which may be configured to process communication data or entertainment data (e.g., game data).

The first and second memory devices 2a and 2b may be one of, for example, DDR2 DRAM, DDR3 DRAM, mobile DRAM, EDP, PRAM, OneDRAM, Pseudo SRAM, LpDDR DRAM, FRAM, Graphic DRAM, or ReRAM. However, example embodiments are not limited thereto. The first and second memory devices 2a and 2b may be configured to have the same operational property.

The logic device 1 and the first memory device 2a may be connected to each other through one channel Ch1 or two channels Ch1 and Ch2. Similarly, the logic device 1 and the second memory device 2b may be connected to each other through one channel Ch3 or two channels Ch3 and Ch4. In example embodiments, the logic device 1 may include a plurality of channels Ch1, Ch2, Ch3, and Ch4, each of which may be configured to control independently a corresponding one of the first and second memory devices 2a and 2b. The channels Ch1, Ch2, Ch3, and Ch4 may be configured to transmit command/address signals and data signals to the memory devices 2a and 2b. Each of the channels Ch1, Ch2, Ch3, and Ch4 may include data pads for sending and receiving data signals and command/address pads for sending and receiving command/address signals. In example embodiments, each of the channels Ch1, Ch2, Ch3, and Ch4 may be configured to interface data signals of 16 bits, 32 bits, or 64 bits.

According to example embodiments of inventive concepts, the semiconductor package may be used in portable devices, such as mobile phones, smart phones, personal digital assistant (PDA) devices, portable multimedia player (PMP) devices, digital multimedia broadcast (DMB) devices, global positioning system (GPS) devices, and/or handheld gaming consoles. However, example embodiments of inventive concepts are not limited thereto.

Each of the memory devices 2a and 2b may be a semiconductor chip and may be assembled to meet a standard (e.g., the JEDEC standard). In this case, the semiconductor chip may have a pin arrangement, in which data pins are separated from command/address pins. For example, in the semiconductor chip, the data pins may be arranged near a first side surface, and the command/address pins may be arranged near a second side surface facing the first side surface.

When the logic device 1 and the memory devices 2a and 2d are packaged, each memory chip may be configured to have data, command, and/or address signals independently applied thereto. Since the ability of processing large data and high performance is desired for the logic devices 1, I/O pins of each logic device 1 may be more than and different from those of the memory chip. Accordingly, an interconnection structure between the memory and logic chips may be complex when the memory and logic chips are mounted in a single semiconductor package. In addition, in the case where a plurality of memory chips are vertically stacked in a semiconductor package, the semiconductor package may have an increased thickness. Accordingly, it is desirable to simplify the interconnection structure between the memory and logic chips in each semiconductor package.

Figure 2:
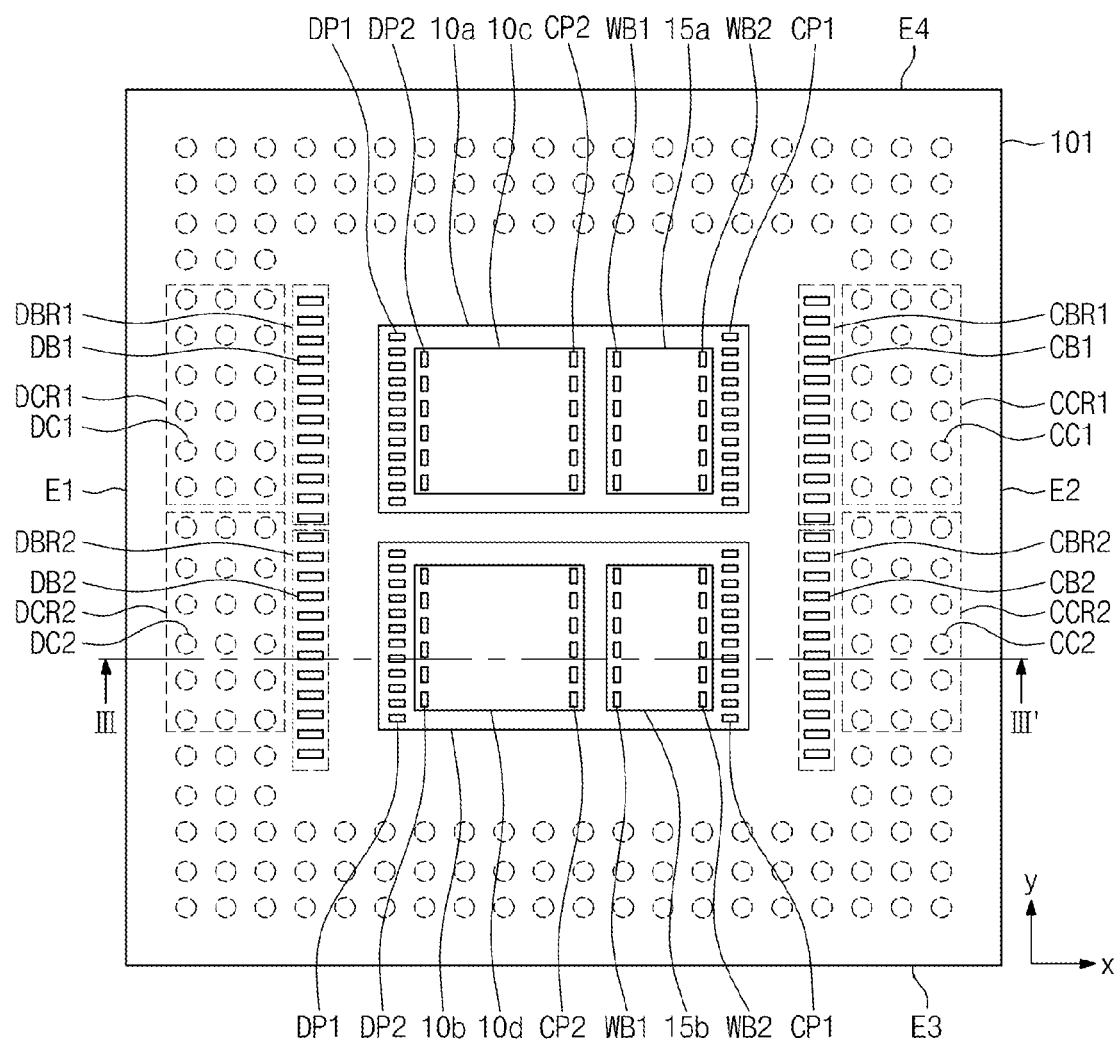
FIG. 2 is a plan view illustrating a first semiconductor package according to example embodiments of inventive concepts.
Figure 3:
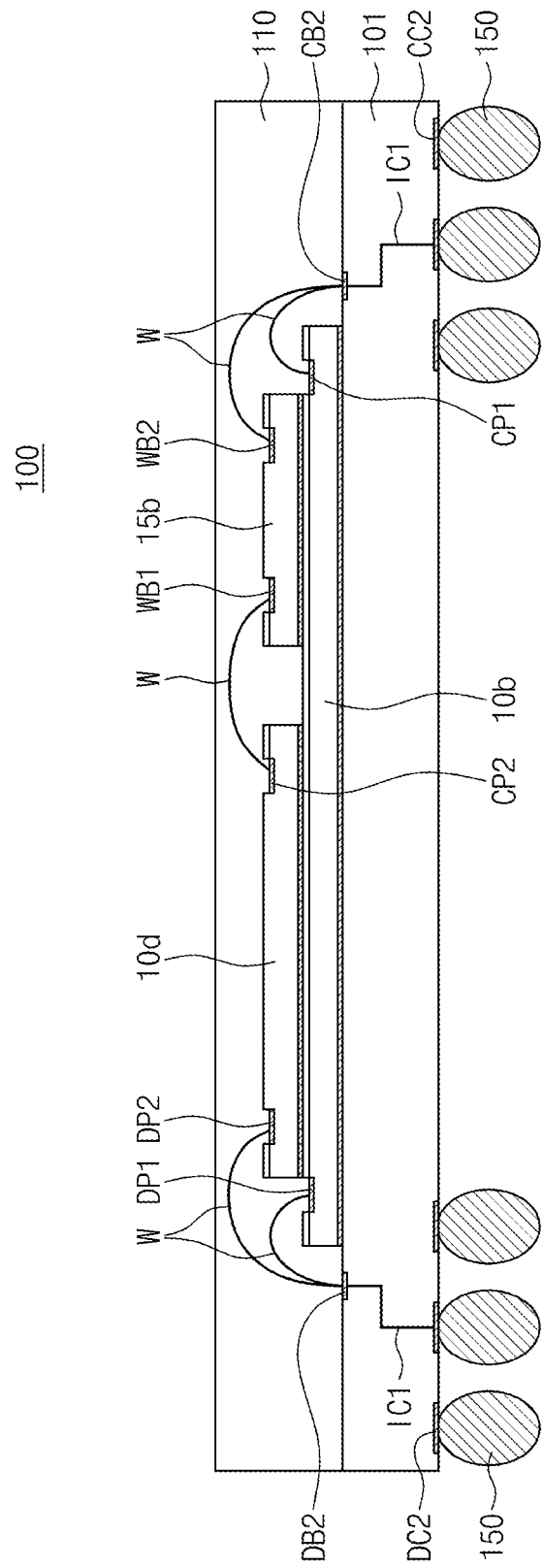
FIG. 3 is a sectional view taken along a line III-III' of FIG. 2 to illustrate a first semiconductor package according to example embodiments of inventive concepts.

FIG. 2 is a plan view illustrating a first semiconductor package according to example embodiments of inventive concepts. FIG. 3 is a sectional view taken along a line III-III' of FIG. 2 to illustrate a first semiconductor package according to example embodiments of inventive concepts.

Referring to FIGS. 2 and 3, a first semiconductor package 100 may include a first package substrate 101, first and second memory chips 10a and 10b mounted on the first package substrate 101, third and fourth memory chips 10c and 10d stacked on the first and second memory chips 10a and 10b, respectively, and first and second jumper chips 15a and 15b stacked on the first and second memory chips 10a and 10b, respectively.

The first and second memory chips 10a and 10b may be disposed spaced apart from each other in a first direction (e.g., y direction of FIG. 2), and the third and fourth memory chips 10c and 10d and the first and second jumper chips 15a and 15b may be provided on the first and second memory chips 10a and 10b. The third memory chip 10c may be disposed spaced apart from the first jumper chip 15a in a second direction (e.g., x direction of FIG. 2). The fourth memory chip 10d may be disposed spaced apart from the second jumper chip 15b in the x direction.

In example embodiments, the first to fourth memory chips 10a, 10b, 10c, and 10d may have the same operational behavior. For example, the first to fourth memory chips 10a, 10b, 10c, and 10d may be 32 bit or 64 bit mobile DRAM. The first memory chip 10a may be of the same kind as the second memory chip 10b, and the third memory chip 10c may be of the same kind as the fourth memory chip 10d. Further, the first and second memory chips 10a and 10b may have a different memory capacity from the third and fourth memory chips 10c and 10d. For example, the first and second memory chips 10a and 10b may have a memory capacity that is twice that of the third and fourth memory chips 10c and 10d. Although not shown, in example embodiments of inventive concepts, a memory chip, which is of the same kind as the first memory chip 10a, may be additionally provided between the first memory chip 10a and the third memory chip 10c. Similarly, a memory chip, which is of the same kind as the second memory chip 10b, may be additionally provided between the second memory chip 10b and the fourth memory chip 10d. Accordingly, it is possible to provide a plurality of memory chips having at least two different memory capacities, and thereby, to realize a multi-chip semiconductor package having a memory capacity that is odd-number times larger than the first memory chip. The third and fourth memory chips 10c and 10d may be smaller than the first and second memory chips 10a and 10b.

Each of the first and second memory chips 10a and 10b may include first memory data pads DP1 for inputting/outputting data signals, first memory command/address pads CP1 for inputting/outputting command and address signals (e.g., data strobe signals, data mask signals, chip selection signals, clock signals, write enable signals, RAS signals, or CAS signals), and power and ground pads, to which ground and power voltages, respectively, are applied. Similarly, each of the third and fourth memory chips 10c and 10d may include second memory data pads DP2 for inputting/outputting data signals, second memory command/address pads CP2 for inputting/outputting command and address signals (e.g., data strobe signals, data mask signals, chip selection signals, clock signals, write enable signals, RAS signals, or CAS signals), and power and ground pads, to which ground and power voltages, respectively, are applied. Here, the memory data pads DP1 and DP2 may be spaced apart from the memory command/address pads CP1 and CP2, respectively. For example, in each of the first to fourth memory chips 10a-10d, the data pads DP1 and DP2 may be disposed adjacent to one side surface of the corresponding chip, while the memory command/address pads CP1 and CP2 may be disposed adjacent to opposite side surface of the corresponding chip.

Each of the first and second jumper chips 15a and 15b may include first and second wire bonding pads WB1 and WB2. The first and second jumper chips 15a and 15b may be a circuit substrate or a circuit film, in which circuit patterns are provided. The first and second wire bonding pads WB1 and WB2 may be spaced apart from each other in the second direction, and be arranged parallel to the memory command/address pads CP1 and CP2. The first wire bonding pads WB1 may be disposed adjacent to the second memory command/address pads CP2. The second wire bonding pads WB2 may be disposed adjacent to the first memory command/address pads CP1.

The first package substrate 101 may include first to fourth edges E1, E2, E3, and E4. The first and third edges E1 and E3 may meet or be adjacent to each other. The first and second edges E1 and E2 may face each other. The third and fourth edges E3 and E4 may face each other. The first to fourth memory chips 10a-10d may be mounted on the first package substrate 101 in such a way that the memory data pads DP1 and DP2 are arranged parallel to the first edge E1.

The first package substrate 101 may include first and second DQ bonding pad regions DBR1 and DBR2 and first and second CA bonding pad regions CBR1 and CBR2. For example, the first DQ bonding pad region DBR1 and the first CA bonding pad region CBR1 may be disposed to face each other, and the second DQ bonding pad region DBR2 and the second CA bonding pad region CBR2 may be disposed to face each other. The first and second DQ bonding pad regions DBR1 and DBR2 may be disposed adjacent to the first edge E1, and the first and second CA bonding pad regions CBR1 and CBR2 may be disposed adjacent to the second edge E2.

In example embodiments, the first and second memory chips 10a and 10b may be mounted on the top surface of the first package substrate 101 in such a way that each of the first memory data pads DP1 of the first and second memory chips 10a and 10b may be arranged adjacent to the first and second DQ bonding pad regions DBR1 and DBR2, and each of the first memory command/address pads CP1 of the first and second memory chips 10a and 10b may be arranged adjacent to the first and second CA bonding pad regions CBR1 and CBR2.

The first package substrate 101 may include first and second DQ coupling pad regions DCR1 and DCR2 and first and second CA coupling pad regions CCR1 and CCR2. The first DQ coupling pad region DCR1 and the first CA coupling pad region CCR1 may be disposed to face each other, and the second DQ coupling pad region DCR2 and the second CA coupling pad region CCR2 may be disposed to face each other. The first and second DQ coupling pad regions DCR1 and DCR2 may be disposed adjacent to the first edge E1, and the first and second CA coupling pad regions CCR1 and CCR2 may be disposed adjacent to the second edge E2. The first and second DQ coupling pad regions DCR1 and DCR2 may be adjacent to the first and second DQ bonding pad regions DBR1 and DBR2, respectively, and the first and second CA coupling pad regions CCR1 and CCR2 may be adjacent to the first and second CA bonding pad regions CBR1 and CBR2, respectively.

The first package substrate 101 may include or be a variety of substrates, such as a printed circuit board, a flexible substrate, and a tape substrate. In example embodiments, the first package substrate 101 may include or be a flexible printed circuit board, a rigid printed circuit board, or any combination thereof, in which internal lines IC1 are provided.

The first package substrate 101 may have a top surface and a bottom surface and be configured to include bonding pads DB1, DB2, CB1, and CB2, the internal lines IC1, and coupling pads DC1, DC2, CC1, and CC2. The bonding pads DB1, DB2, CB1, and CB2 may be arranged on the top surface of the first package substrate 101, and the coupling pads DC1, DC2, CC1, and CC2 may be arranged on the bottom surface of the first package substrate 101. The first to fourth memory chips 10a-10d may be provided on a central region of the first package substrate 101.

In example embodiments, bonding pads may include the first and second DQ bonding pads DB1 and DB2 connected to the first and second memory data pads DP1 and DP2 through wires W, and the first and second CA bonding pads CB1 and CB2 connected to the first memory command/address pads CP1 and the second wire bonding pads WB2 through the wires W. The second memory command/address pads CP2 may be connected to the first wire bonding pads WB1. The wire bonding pads WB1 and WB2 may be electrically connected to each other via an internal circuit. For example, the first and second DQ bonding pads DB1 and DB2 may be disposed in the first and second DQ bonding pad regions DBR1 and DBR2, respectively, and the first and second CA bonding pads CB1 and CB2 may be disposed in the first and second CA bonding pad regions CBR1 and CBR2, respectively The coupling pads may include the first and second DQ coupling pads DC1 and DC2 connected to the first and second DQ bonding pads DB1 and DB2 through the internal lines IC1, and the first and second CA coupling pads CC1 and CC2 connected to the first and second CA bonding pads CB1 and CB2 through the internal lines IC1. For example, the first and second DQ coupling pads DC1 and DC2 may be disposed in the first and second DQ coupling pad regions DCR1 and DCR2, respectively, and the first and second CA coupling pads CC1 and CC2 may be disposed in the first and second CA coupling pad regions CCR1 and CCR2, respectively.

The first semiconductor package 100 may include a first molding layer 110 covering the first to fourth memory chips 10a-10d and jumper chips 15a and 15b. The first molding layer 110 may be provided between the first package substrate 101 and the first and second memory chips 10a and 10b to fill a gap region there between. For example, the first molding layer 110 may serve as an under-fill layer. The first molding layer 110 may include an epoxy molding compound.

Figure 4:
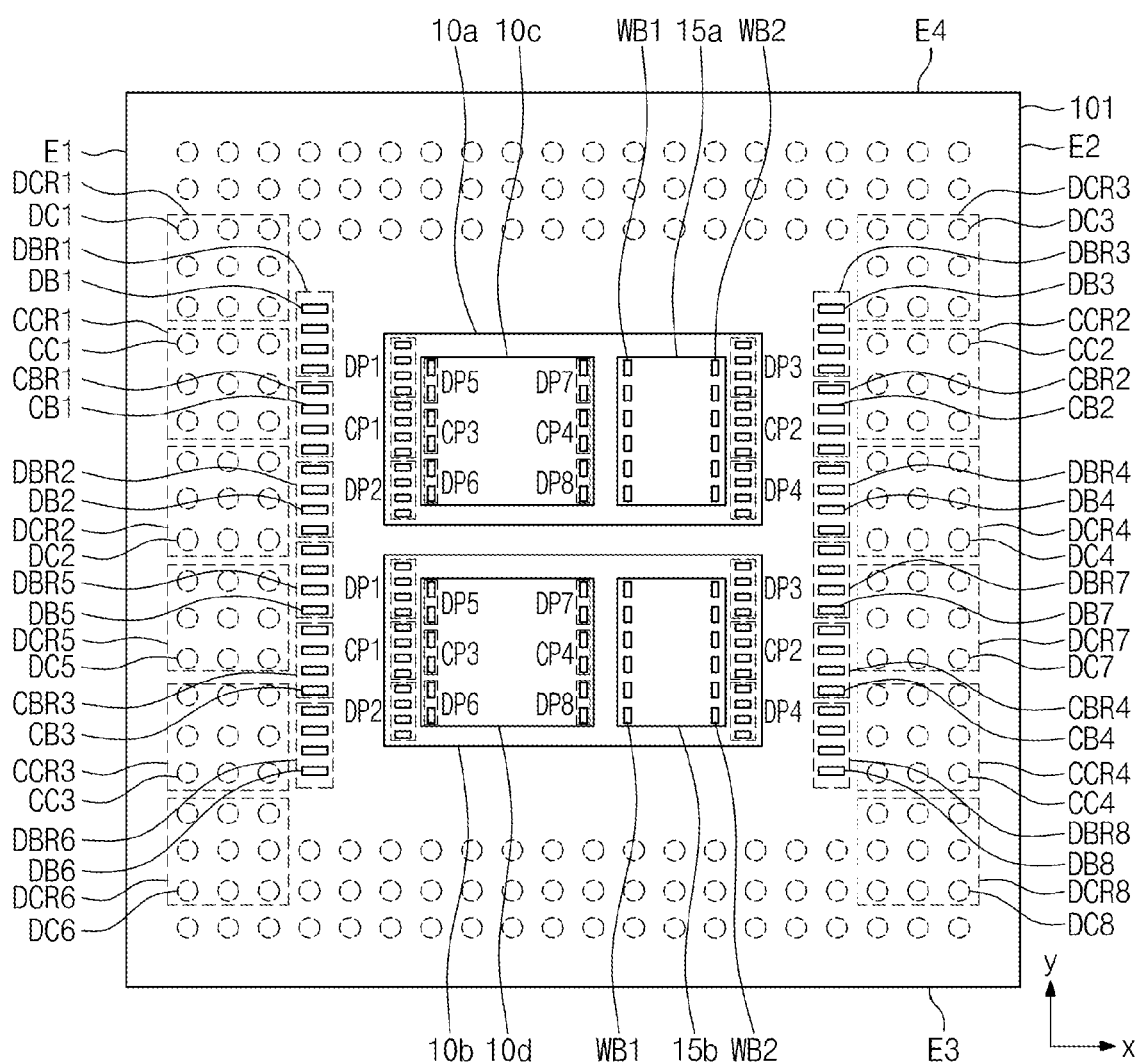
FIG. 4 is a plan view illustrating a first semiconductor package according to other example embodiments of inventive concepts.

FIG. 4 is a plan view illustrating a first semiconductor package according to example embodiments of inventive concepts. For the sake of brevity, the elements and features of this example that are similar to those previously shown and described will not be described in much further detail.

Referring to FIG. 4, each of the first and second memory chips 10a and 10b may include the first to fourth memory data pads DP1, DP2, DP3, and DP4 and the first and second memory command/address pads CP1 and CP2. Similarly, each of the third and fourth memory chips 10c and 10d may include fifth to eighth memory data pads DP5, DP6, DP7, and DP8 and third and fourth memory command/address pads CP3 and CP4. The first and second memory data pads DP1 and DP2 and the first memory command/address pads CP1 may be provided adjacent to one side surface of each of the first and second memory chips 10a and 10b, and the third and fourth memory data pads DP3 and DP4 and the second memory command/address pads CP2 may be provided adjacent to other side surface opposite thereto. The first memory command/address pads CP1 may be disposed between the first and second memory data pads DP1 and DP2. The second memory command/address pads CP2 may be disposed between the third and fourth memory data pads DP3 and DP4. Although not shown, in example embodiments, on one side surface of each of the first and second memory chips 10a and 10b, the first and second memory data pads DP1 and DP2 and the first memory command/address pads CP1 may be arranged along the y direction in the arrangement order of the first memory data pads DP1/the second memory data pads DP2/the first memory command/address pads CP1. Further, on other side surface of each of the first and second memory chips 10a and 10b, the third and fourth memory data pads DP3 and DP4 and the second memory command/address pads CP2 may be arranged in the same arrangement order.

Similarly, the fifth to eighth memory data pads DP5-DP8 and the third and fourth memory command/address pads CP3 and CP4 in each of the third and fourth memory chips 10c and 10d may be arranged to have substantially the same arrangement as the first to fourth memory data pads DP1-DP4 and the first and second memory command/address pads CP1 and CP2 in the first and second memory chips 10a and 10b. For example, the fifth and sixth memory data pads DP5 and DP6 and the third memory command/address pads CP3 may be provided adjacent to one side surface of each of the third and fourth memory chips 10c and 10d, and the seventh and eighth memory data pads DP7 and DP8 and the fourth command/address pads CP2 may be provided adjacent to other side surface opposite thereto. The third memory command/address pads CP3 may be disposed between the fifth and sixth memory data pads DP5 and DP6. The fourth memory command/address pads CP4 may be disposed between the seventh and eighth memory data pads DP7 and DP8.

The first package substrate 101 may include the first to eighth DQ bonding pad regions DBR1-DBR8, in which the first to eighth DQ bonding pads DB1-DB8, respectively, are disposed, and the first to fourth CA bonding pad regions CBR1-CBR4, in which the first to fourth CA bonding pads CB1-CB4, respectively, are disposed. For example, the first and second DQ bonding pad regions DBR1 and DBR2 and the first CA bonding pad region CBR1 may be disposed adjacent to the first edge E1. By contrast, third and fourth DQ bonding pad regions DBR3 and DBR4 and the second CA bonding pad region CBR2 may be disposed adjacent to the second edge E2.

In example embodiments, the first memory chips 10a and 10b may be mounted on the top surface of the first package substrate 101 in such a way that the first and second memory data pads DP1 and DP2 and the first memory command/address pads CP1 may be disposed adjacent to the first and second DQ bonding pad regions DBR1 and DBR2 and the first CA bonding pad region CBR1, respectively, and the third and fourth memory data pads DP3 and DP4 and the second memory command/address pads CP2 may be disposed adjacent to the third and fourth DQ bonding pad regions DBR3 and DBR4 and the second CA bonding pad region CBR2, respectively. For example, the first and second DQ bonding pad regions DBR1 and DBR2 and the first CA bonding pad region CBR1 may be arranged to be associated with the first and second memory data pads DP1 and DP2 and the first memory command/address pads CP1, respectively, and the third and fourth DQ bonding pad regions DBR3 and DBR4 and the second CA bonding pad region CBR2 may be arranged to be associated with the third and fourth memory data pads DP3 and DP4 and the second memory command/address pads CP2, respectively. In other words, the first and second DQ bonding pad regions DBR1 and DBR2 and the first CA bonding pad region CBR1 may be arranged to have the same arrangement order as that of the first and second memory data pads DP1 and DP2 and the first memory command/address pads CP1, and the third and fourth DQ bonding pad regions DBR3 and DBR4 and the second CA bonding pad region CBR2 may be arranged to have the same arrangement order as that of the third and fourth memory data pads DP3 and DP4 and the second memory command/address pads CP2.

Similarly, fifth and sixth DQ bonding pad regions DBR5 and DBR6 and a third CA bonding pad region CBR3 may be disposed adjacent to the first and second memory data pads DP1 and DP2 and the first memory command/address CP1, respectively, of the second memory chip 10b, and seventh and eighth DQ bonding pad regions DBR7 and DBR8 and a fourth CA bonding pad region CBR4 may be disposed adjacent to the third and fourth memory data pads DP3 and DP4 and the second memory command/address pads CP2, respectively, of the second memory chip 10b.

The first package substrate 101 may include the first to and eighth DQ coupling pad regions DCR1-DCR8, in which the first to and eighth DQ coupling pads DC1-DC8, respectively, are disposed, and the first to fourth CA coupling pad regions CCR1-CCR4, in which the first to fourth CA coupling pads CC1-CC4, respectively, are disposed. The first and second DQ coupling pad regions DCR1 and DCR2 and the first CA coupling pad region CCR1 may be disposed adjacent to the first edge E1. Third and fourth DQ coupling pad regions DCR3 and DCR4 and the second CA coupling pad region CCR2 may be disposed adjacent to the second edge E2. The first and second DQ coupling pad regions DCR1 and DCR2 and the first CA coupling pad region CCR1 may be disposed adjacent to the first and second DQ bonding pad regions DBR1 and DBR2 and the first CA bonding pad region CBR1, respectively, and the third and fourth DQ coupling pad regions DCR3 and DCR4 and the second CA coupling pad region CCR2 may be disposed adjacent to the third and fourth DQ bonding pad regions DBR3 and DBR4 and the second CA bonding pad region CBR2, respectively. Similarly, fifth and sixth DQ coupling pad regions DCR5 and DCR6 and a third CA coupling pad region CCR3 may be disposed adjacent to the fifth and sixth DQ bonding pad regions DBR5 and DBR6 and the third CA bonding pad region CBR3, respectively, and seventh and eighth DQ coupling pad regions DCR7 and DCR8 and a fourth CA coupling pad region CCR4 may be disposed adjacent to the seventh and eighth DQ bonding pad regions DBR7 and DBR8 and the fourth CA bonding pad region CBR4, respectively.

The first and second memory data pads DP1 and DP2 and the first memory command/address pads CP1 of the first and second memory chips 10a and 10b may be connected to the DQ bonding pads DB1, DB2, DB5, and DB6 and the CA bonding pads CB1 and CB3, respectively, through the wires W (e.g., of FIG. 3). Similarly, the third and fourth memory data pads DP3 and DP4 and the second memory command/address pads CP2 of the first and second memory chips 10a and 10b may be connected to DQ bonding pads DB3, DB4, DB7, and DB8 and the CA bonding pads CB2 and CB4, respectively. Further, the bonding pads DB1-DB8 and CB1-CB4 may be connected to the coupling pads DC1-DC8 and CC1-CC4, respectively, through the internal lines IC1 (e.g., of FIG. 3).

The memory data pads DP5 and DP6 and the memory command/address pads CP3 of the third and fourth memory chips 10c and 10d may be connected to the DQ bonding pads DB1, DB2, DB5, and DB6 and the CA bonding pads CB1 and CB3, respectively. Similarly, the memory data pads DP7 and DP8 and the memory command/address pads CP4 of the third and fourth memory chips 10c and 10d may be connected to the DQ bonding pads DB3, DB4, DB7, and DB8 and the CA bonding pads CB2 and CB4, respectively, through the jumper chips 15a and 15b.

Figure 5:
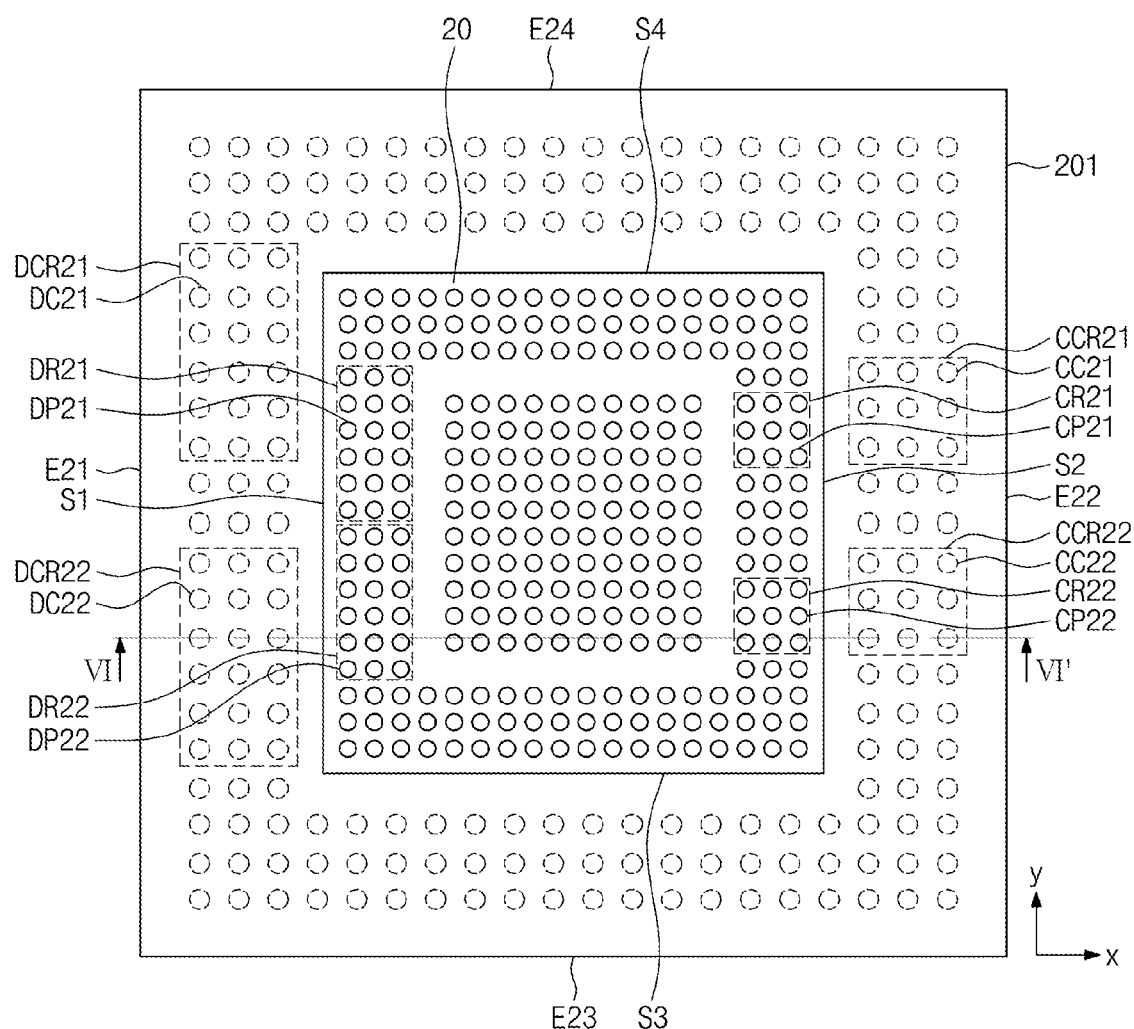
FIG. 5 is a plan view illustrating a second semiconductor package according to example embodiments of inventive concepts.
Figure 6:
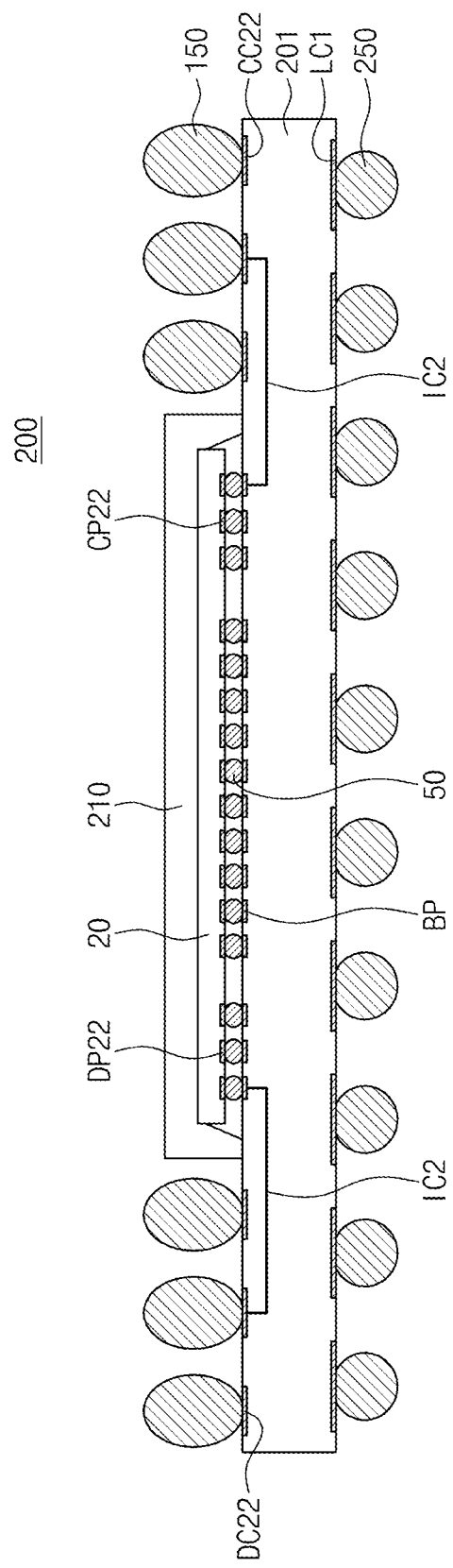
FIG. 6 is a sectional view taken along a line VI-VI' of FIG. 5 to illustrate a second semiconductor package according to example embodiments of inventive concepts.

FIG. 5 is a plan view illustrating a second semiconductor package according to example embodiments of inventive concepts. FIG. 6 is a sectional view taken along a line VI-VI' of FIG. 5 to illustrate a second semiconductor package according to example embodiments of inventive concepts.

Referring to FIGS. 5 and 6, a second semiconductor package 200 may include a second package substrate 201 and a logic chip 20 mounted on the second package substrate 201.

The logic chip 20 may include first to fourth side surfaces S1, S2, S3, and S4, and the first and third side surfaces S1 and S3 may be adjacent to each other. The first and second side surfaces S1 and S2 may face each other and the third and fourth side surfaces S3 and S4 may face each other.

In example embodiments, the logic chip 20 may include first and second data pad regions DR21 and DR22 and first and second command/address pad regions CR21 and CR22.

For example, the first data pad region DR21 may be disposed to face the first command/address pad region CR21, and the second data pad region DR22 may be disposed to face the second command/address pad region CR22. The first and second data pad regions DR21 and DR22 may be provided adjacent to the first side surface S1, and the first and second command/address pad regions CR21 and CR22 may be provided adjacent to the second side surface S2. Each of the first and second data pad regions DR21 and DR22 may have an area that is larger than that of a corresponding one of the first and second command/address pad regions CR21 and CR22. Further, the second data pad region DR22 may be disposed adjacent to the first data pad region DR21 of the first side surface S1, and the second command/address pad region CR22 may be disposed adjacent to the first command/address pad region CR21 of the second side surface S2.

The second package substrate 201 may include first to fourth edges E21, E22, E23, and E24, where the first and third edges E21 and E23 may meet or be adjacent to each other. The first and second edges E21 and E22 may face each other, and the third and fourth edges E23 and E24 may face each other. The logic chip 20 may be mounted on the second package substrate 201 in such a way that the first edge E21 of the second package substrate 201 is parallel to the first side surface S1 of the logic chip 20.

The second package substrate 201 may include first and second DQ coupling pad regions DCR21 and DCR22 and first and second CA coupling pad regions CCR21 and CCR22. The first DQ coupling pad region DCR21 may be disposed to face the first CA coupling pad region CCR21, and the second DQ coupling pad region DCR22 may be disposed to face the second CA coupling pad region CCR22. The first and second DQ coupling pad regions DCR21 and DCR22 may be disposed adjacent to the first edge E21, and the first and second CA coupling pad regions CCR21 and CCR22 may be disposed adjacent to the second edge E2. For example, the first DQ coupling pad region DCR21 may be disposed between the first data pad region DR21 and the first edge E21, and the first CA coupling pad region CCR21 may be disposed between the first command/address pad region CR21 and the second edge E22. Similarly, the second DQ coupling pad region DCR22 may be disposed between the second data pad region DR22 and the first edge E21, and the second CA coupling pad region CCR22 may be disposed between the second command/address pad region CR22 and the second edge E22. Each of the first and second DQ coupling pad regions DCR21 and DCR22 may have an area that is larger than that of a corresponding one of the first and second CA coupling pad regions CCR21 and CCR22.

The logic chip 20 may include first and second data pads DP21 and DP22 for inputting/outputting data signals to/from the memory chip, the first and second command/address pads CP21 and CP22 for inputting/outputting command and address signals to/from the memory chip, and power and ground pads, to which ground and power voltages, respectively, are applied.

The logic chip 20 may include the channels Ch1-Ch4, as described with reference to FIG. 1. In example embodiments, the first data pads DP21 and the first command/address pads CP21 may constitute the first channel, and the second data pads DP22 and the second command/address pads CP22 may constitute the second channel.

The first data pads DP21 may be disposed in the first data pad region DR21, and the first command/address pads CP21 may be disposed in the first command/address pad region CR21. Similarly, the second data pads DP22 may be disposed in the second data pad region DR22, and the second command/address pads CP22 may be disposed in the second command/address pad region CR22.

The logic chip 20 may be mounted on the second package substrate 201 in a wire bonding or flip-chip bonding manner. For example, the logic chip 20 may be mounted on the second package substrate 201 in the flip-chip bonding manner. In other words, the first and second data pads DP21 and DP22 and the first and second command/address pads CP21 and CP22 of the logic chip 20 may be bump pads, to which conductive bumps 50 are attached. Accordingly, the first and second data pads DP21 and DP22 and the first and second command/address pads CP21 and CP22 may be bonded on bonding pads BP of the second package substrate 201 using the conductive bumps 50, and as a result, the logic chip 20 may be mounted on the second package substrate 201.

In example embodiments of inventive concepts, the logic chip 20 may be one of an optoelectronic device, a communication device, a digital signal processor, a controller, and/or a system-on-chip. For example, the logic chip 20 may be a digital base band modem chip and/or an analog base band modem chip.

The second package substrate 201 may include or be a variety of substrates, such as a printed circuit board, a flexible substrate, and a tape substrate. In example embodiments, the second package substrate 201 may include or be a flexible printed circuit board, a rigid printed circuit board, or any combination thereof, in which internal lines IC2 are provided.

The second package substrate 201 may have a top surface and a bottom surface and include bonding pads BP, coupling pads DC21, DC22, CC21, and CC22, external coupling pads LC1, and internal lines IC2. The bonding pads BP and the coupling pads DC21, DC22, CC21, and CC22 may be arranged on the top surface of the second package substrate 201, and the external coupling pads LC1 may be arranged on the bottom surface of the second package substrate 201.

In example embodiments, the coupling pads DC21, DC22, CC21, and CC22 may be provided around the logic chip 20 and be electrically connected to the bonding pads BP via the internal lines IC2. The coupling pads DC21, DC22, CC21, and CC22 may be electrically connected to the external coupling pads LC1 via the internal lines IC2. The bonding pads BP may be provided on a central region of the second package substrate 201, on which the logic chip 20 is mounted, and be connected to the first and second data pads DP21 and DP22 and the first and second command/address pads CP21 and CP22 of the logic chip 20 through the conductive bumps 50. Connection coupling terminals 150 (e.g., solder balls or solder bumps) may be attached to the coupling pads DC21, DC22, CC21, and CC22, respectively. External coupling terminals 250 (e.g., solder balls or solder bumps) may be attached to the external coupling pads LC1, respectively. For example, the first and second DQ coupling pads DC21 and DC22 may be disposed in the first and second DQ coupling pad regions DCR21 and DCR22, respectively, and the first and second CA coupling pads CC21 and CC22 may be disposed in the first and second CA coupling pad regions CCR21 and CCR22, respectively.

The first DQ coupling pads DC21 may be connected to the first data pads DP21 through the internal lines IC2. The first CA coupling pads CC21 may be connected to the first command/address pads CP21 through the internal lines IC2. The second DQ coupling pads DC22 may be connected to the second data pads DP22 through the internal lines IC2. The second CA coupling pads CC2 may be connected to the second command/address pads CP22 through the internal lines IC2.

The second semiconductor package 200 may include a second molding layer 210 covering the logic chip 20. The second molding layer 210 may be provided between the second package substrate 201 and the logic chip 20 to fill a gap region therebetween. For example, the second molding layer 210 may serve as an under-fill layer. The second molding layer 210 may include an epoxy molding compound. The second molding layer 210 may be provided to expose the coupling pads DC21, DC22, CC21, and CC22 of the second package substrate 201.

Figure 7:
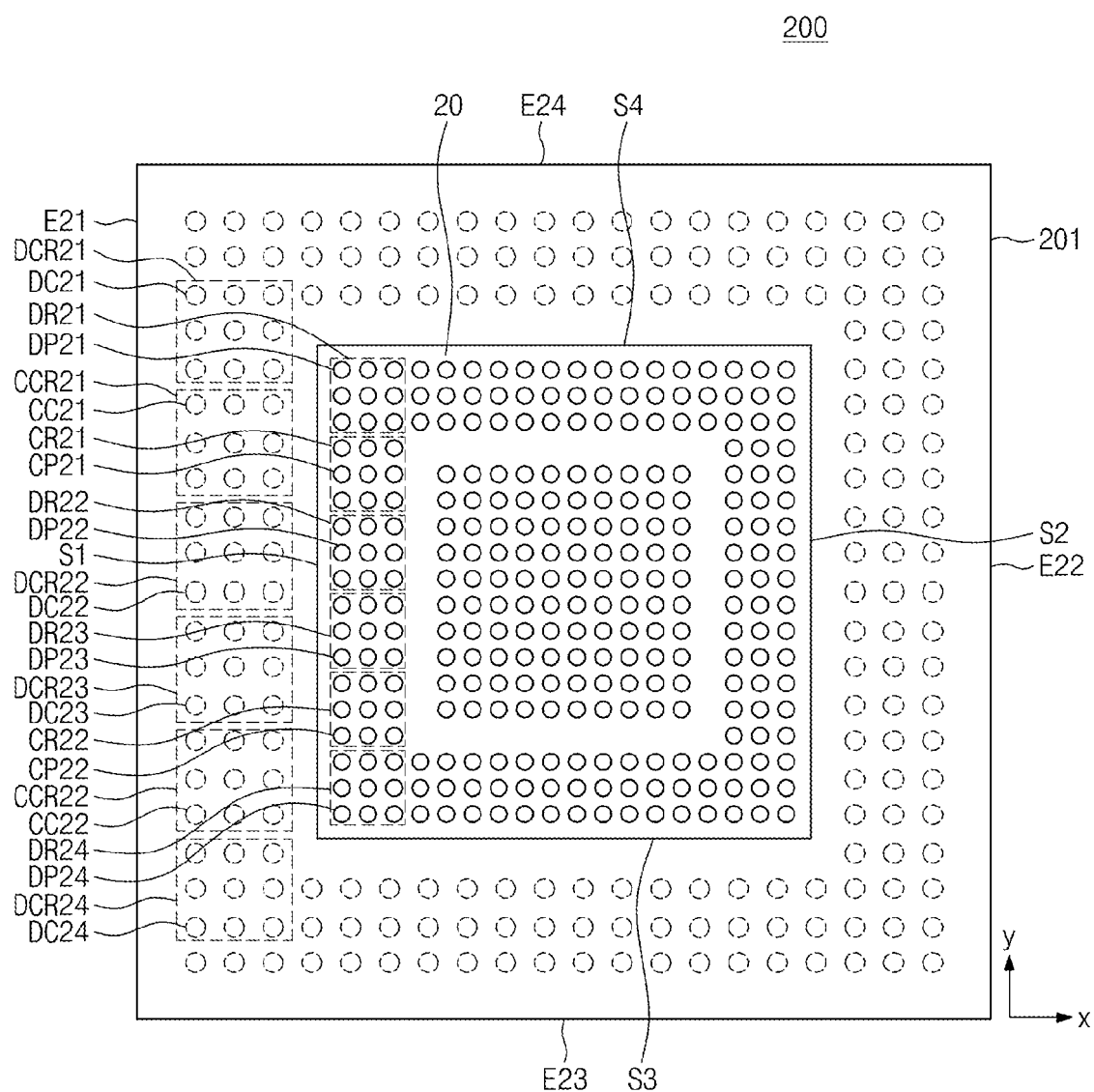
FIG. 7 is a plan view illustrating a second semiconductor package according to example embodiments of inventive concepts.

FIG. 7 is a plan view illustrating a second semiconductor package according to example embodiments of inventive concepts. For the sake of brevity, the elements and features of this example that are similar to those previously shown and described will not be described in much further detail.

Referring to FIG. 7, the logic chip 20 may include the first to fourth data pad regions DR21, DR22, DR23, and DR24 and the first and second command/address pad regions CR21 and CR22. For example, the first to fourth data pad regions DR21, DR22, DR23, and DR24 and the first and second command/address pad regions CR21 and CR22 may be disposed adjacent to the first side surface S1 of the logic chip 20. In example embodiments, the first command/address pad region CR21 may be disposed between the first and second data pad regions DR21 and DR22, and the second command/address pad region CR22 may be disposed between the third and fourth data pad regions DR23 and DR24. For example, the first to fourth data pad regions DR21, DR22, DR23, and DR24 and the first and second command/address pad regions CR21 and CR22 may be arranged along the y direction in the arrangement order of the first data pad region DR21/the first command/address pad region CR21/the second data pad region DR22/the third data pad region DR23/the second command/address pad region CR22/the fourth data pad region DR24.

Although not shown, the first to fourth data pad regions DR21, DR22, DR23, and DR24 and the first and second command/address pad regions CR21 and CR22 may alternatively be arranged along the y direction in the arrangement order of the first data pad region DR21/the second data pad region DR22/the first command/address pad region CR21/the third data pad region DR23/the fourth data pad region DR24/the second command/address pad region CR22.

The logic chip 20 may include the first to fourth data pads DP21, DP22, DP23, and DP24 for inputting/outputting data signals to/from the memory chip, the first and second command/address pads CP21 and CP22 for inputting/outputting command and address signals to/from the memory chip, and power and ground pads, to which ground and power voltages, respectively, are applied. The first to fourth data pads DP21-DP24 and the first and second command/address pads CP21 and CP22 may be disposed in the first to fourth data pad regions DR21-DR24 and the first and second command/address pad regions CR21 and CR22, respectively. The first and second data pads DP21 and DP22 and the first command/address pads CP21 may constitute the first channel. The third and fourth data pads DP23 and DP24 and the second command/address pads CP22 may constitute the second channel.

The first to fourth DQ coupling pad regions DCR21, DCR22, DCR23, and DCR24 and the first and second CA coupling pad regions CCR21 and CCR22 may be disposed adjacent to the first edge E21 of the second package substrate 201. The first to fourth coupling pad regions DCR21-DCR24 and the first and second CA coupling pad regions CCR21 and CCR22 may be arranged to have the same arrangement order as the first to fourth data pad regions DR21-DR24 and the first and second command/address pad regions CR21 and CR22 of the logic chip 20. For example, the first to fourth coupling pad regions DCR21-DCR24 and the first and second CA coupling pad region CCR21 and CCR22 may be disposed to be adjacent to the first to fourth data pad regions DR21-DR24 and the first and second command/address pad regions CR21 and CR22, respectively. The first to fourth DQ coupling pads DC21, DC22, DC23, and DC24 and the first and second CA coupling pads CC21 and CC22 may be disposed in the first to fourth DQ coupling pad regions DCR21-DCR24 and the first and second CA coupling pad region CCR21 and CCR22, respectively.

The first to fourth DQ coupling pads DC21, DC22, DC23, and DC24 and the first and second CA coupling pads CC21 and CC22 may be electrically connected to the first to fourth data pads DP21-DP24 and the first and second command/address pads CP21 and CP22, respectively, of the logic chip 20 via the internal lines IC2 (e.g., of FIG. 6).

Figure 8:
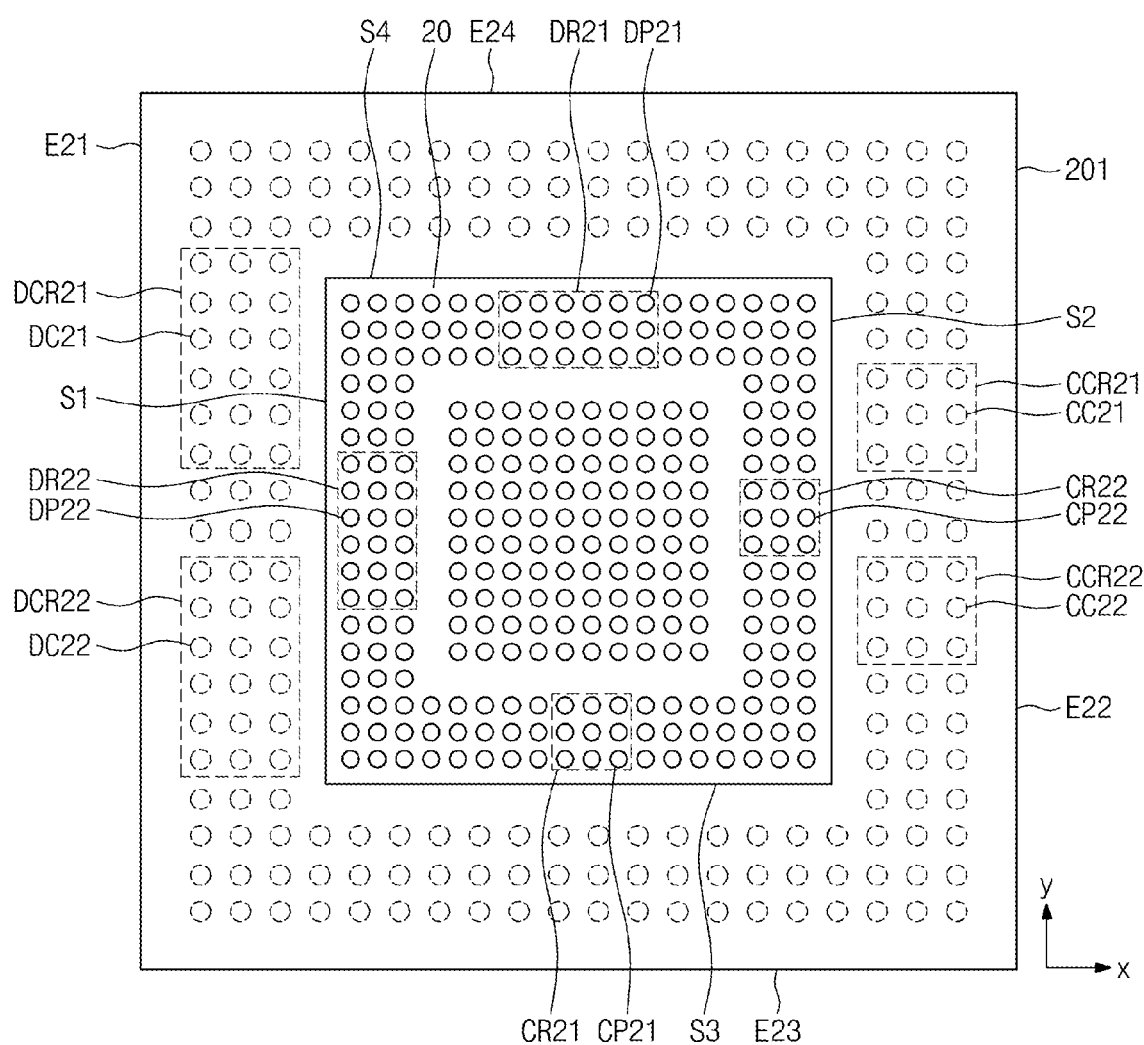
FIG. 8 is a plan view illustrating a second semiconductor package according to example embodiments of inventive concepts.

FIG. 8 is a plan view illustrating a second semiconductor package according to example embodiments of inventive concepts. For the sake of brevity, the elements and features of this example that are similar to those previously shown and described will not be described in much further detail.

Referring to FIG. 8, the logic chip 20 may include the first and second data pad regions DR21 and DR22, in which the first and second data pads DP21 and DP22, respectively, are disposed, and the first and second command/address pad regions CR21 and CR22, in which the first and second command/address pads CP21 and CP22, respectively, are disposed.

For example, the first data pad region DR21 may be disposed to face the first command/address pad region CR21. The first data pad region DR21 may be disposed adjacent to the fourth side surface S4, and the first command/address pad region CR21 may be disposed adjacent to the third side surface S3. An area of the first data pad region DR21 may be larger than that of the first command/address pad region CR21. The second data pad region DR22 may be disposed to face the second command/address pad region CR22. The second data pad region DR22 may be disposed adjacent to the first side surface S1, and the second command/address pad region CR22 may be disposed adjacent to the second side surface S2. An area of the second data pad region DR22 may be larger than that of the second command/address pad region CR22.

In example embodiments, the first data pads DP21 and the first command/address pads CP21 may constitute the first channel, and the second data pads DP22 and the second command/address pads CP22 may constitute the second channel.

The second package substrate 201 may include the first and second DQ coupling pad regions DCR21 and DCR22, in which the first and second DQ coupling pads DC1 and DC2, respectively, are disposed, and the first and second CA coupling pad regions CCR21 and CCR22, in which the first and second CA coupling pads CC1 and CC2, respectively, are disposed. For example, the first DQ coupling pad region DCR21 may be disposed to face the first CA coupling pad region CCR21, and the second DQ coupling pad region DCR22 may be disposed to face the second CA coupling pad region CCR22. The first and second DQ coupling pad regions DCR21 and DCR22 may be provided adjacent to the first edge E21, and the first and second CA coupling pad regions CCR21 and CCR22 may be provided adjacent to the second edge E2. The first DQ coupling pad region DCR21 may be provided adjacent to the second DQ coupling pad region DCR22, and the first CA coupling pad region CCR21 may be provided adjacent to the second CA coupling pad region CCR22. An area of the first and second DQ coupling pad regions DCR21 and DCR22 may be larger than that of the first and second CA coupling pad regions CCR21 and CCR2.

The first DQ coupling pads DC21 may be electrically connected to the first data pads DP21, and the first CA coupling pads CC21 may be electrically connected to the first command/address pads CP21. The second DQ coupling pads DC22 may be electrically connected to the second data pads DP22, and the second CA coupling pads CC2 may be electrically connected to the second command/address pads CP22.

Figure 9:
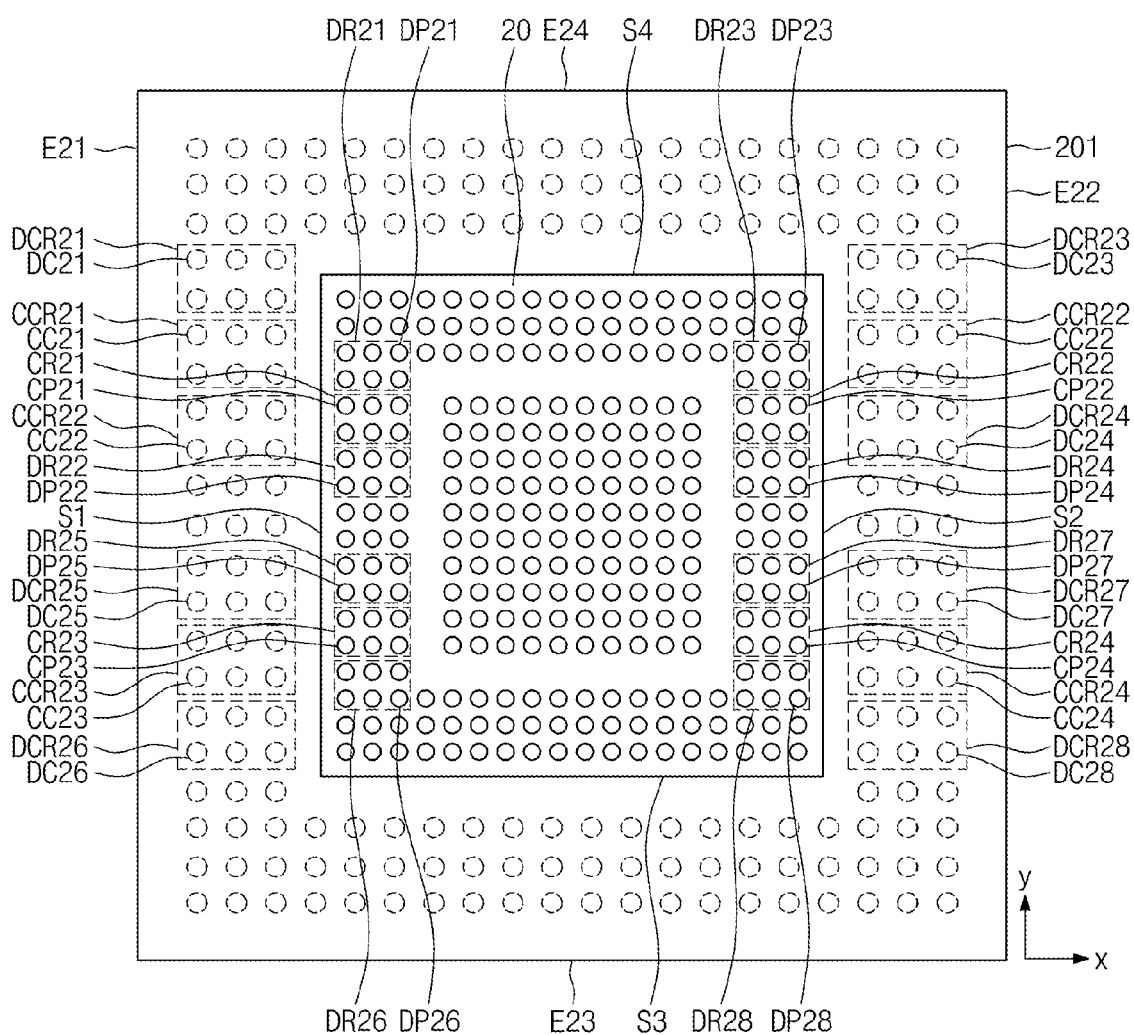
FIG. 9 is a plan view illustrating a second semiconductor package according to example embodiments of inventive concepts.

FIG. 9 is a plan view illustrating a second semiconductor package according to example embodiments of inventive concepts. For the sake of brevity, the elements and features of this example that are similar to those previously shown and described will not be described in much further detail.

Referring to FIG. 9, the logic chip may include first to eighth data pad regions DR21-DR28, in which first to eighth data pads DP21-DP28, respectively, are disposed, and the first to fourth command/address pad regions CR21-CR24, in which the first to fourth command/address pads CP21-CP24, respectively, are disposed.

For example, the first and second data pad regions DR21 and DR22 and the first command/address pad region CR21 may be disposed adjacent to the first side surface S1. The third and fourth data pad regions DR23 and DR24 and the second command/address pad region CR22 may be disposed adjacent to the second side surface S2. In example embodiments, the first command/address pad region CR21 may be disposed between the first and second data pad regions DR21 and DR22. Similarly, the second command/address pad region CR22 may be disposed between the third and fourth data pad regions DR23 and DR24. Although not shown, in other example embodiments, the first and second data pad regions DR21 and DR22 and the first command/address pad region CR21 may be arranged along the y direction in the arrangement order of the first data pad region DR21/the second data pad region DR22/the first command/address pad region CR21. Similarly, the third and fourth data pad regions DR23 and DR24 and the second command/address pad region CR22 may be arranged along the y direction in the arrangement order of the third data pad region DR23/the fourth data pad region DR24/the second command/address pad region CR22.

Fifth and sixth data pad regions DR25 and DR26 and a third command/address pad region CR23 may be disposed spaced apart from the second data pad region DR22 in the y direction and adjacent to the first side surface S1. Seventh and eighth data pad regions DR27 and DR28 and a fourth command/address pad region CR24 may be disposed spaced apart from the fourth data pad region DR24 in the y direction and adjacent to the second side surface S2. The fifth and sixth data pad regions DR25 and DR26 and the third command/address pad region CR23 may be arranged to have the same arrangement order as that of the first and second data pad regions DR21 and DR22 and the first command/address pad region CR21. Similarly, the seventh and eighth data pad regions DR27 and DR28 and the fourth command/address pad region CR24 may be arranged to have the same arrangement order as that of the third and fourth data pad regions DR23 and DR24 and the second command/address pad region CR22. For example, the third command/address pad region CR23 may be disposed between the fifth and sixth data pad regions DR25 and DR26, and the fourth command/address pad region CR24 may be disposed between the seventh and eighth data pad regions DR27 and DR28.

In example embodiments, the first and second data pads DP21 and DP22 and the first command/address pads CP21 may constitute the first channel, and the third and fourth data pads DP23 and DP24 and the second command/address pads CP22 may constitute the second channel. Fifth and sixth data pads DP25 and DP26 and third command/address pads CP23 may constitute the third channel, and seventh and eighth data pads DP27 and DP28 and fourth command/address pads CP24 may constitute the fourth channel.

The second package substrate 201 may include the first to eighth DQ coupling pad regions DCR21-DCR28, in which the first to eighth DQ coupling pads DC1-DC8, respectively, are disposed, and the first to fourth CA coupling pad regions CCR21-CCR24, in which the first to fourth CA coupling pads CC1-CC4, respectively, are disposed. For example, the first and second DQ coupling pad regions DCR21 and DCR22 and the first CA coupling pad region CCR21 may be disposed adjacent to the first edge E21 of the second package substrate 201. By contrast, the third and fourth DQ coupling pad regions DCR23 and DCR24 and the second CA coupling pad region CCR22 may be disposed adjacent to the second edge E22. The first and second DQ coupling pad regions DCR21 and DCR22 and the first CA coupling pad region CCR21 may be arranged to have the same arrangement order as the first and second data pad regions DR21 and DR22 and the first command/address pad region CR21, respectively, of the logic chip 20. Similarly, the third and fourth DQ coupling pad regions DCR23 and DCR24 and the second CA coupling pad region CCR22 may be arranged to have the same arrangement order as the third and fourth data pad regions DR23 and DR24 and the second command/address pad region CR22, respectively, of the logic chip 20. For example, the first and second DQ coupling pad regions DCR21 and DCR22 and the first CA coupling pad region CCR21 may be disposed adjacent to the first and second data pad regions DR21 and DR22 and the first command/address pad region CR21, respectively, and the third and fourth DQ coupling pad regions DCR23 and DCR24 and the second CA coupling pad region CCR22 may be disposed adjacent to the third and fourth data pad regions DR23 and DR24 and the second command/address pad region CR22, respectively.

Fifth and sixth DQ coupling pad regions DCR25 and DCR26 and a third CA coupling pad region CCR23, which correspond to the fifth and sixth data pad regions DR25 and DR26 and the third command/address pad region CR23, respectively, of the logic chip 20, may be disposed adjacent to the first edge E21. Similarly, seventh and eighth DQ coupling pad regions DCR27 and DCR28 and a fourth CA coupling pad region CCR24, which correspond to the seventh and eighth data pad regions DR27 and DR28 and the fourth command/address pad region CR24, respectively, of the logic chip 20, may be disposed adjacent to the second edge E22.

The first to eighth data pads DP21-DP28 may be electrically connected to the first to eighth DQ coupling pads DC1-DC8, respectively, and the first to fourth command/address pads CP21-CP24 may be electrically connected to the first to fourth CA coupling pads CC1-CC4, respectively.

Figure 10:
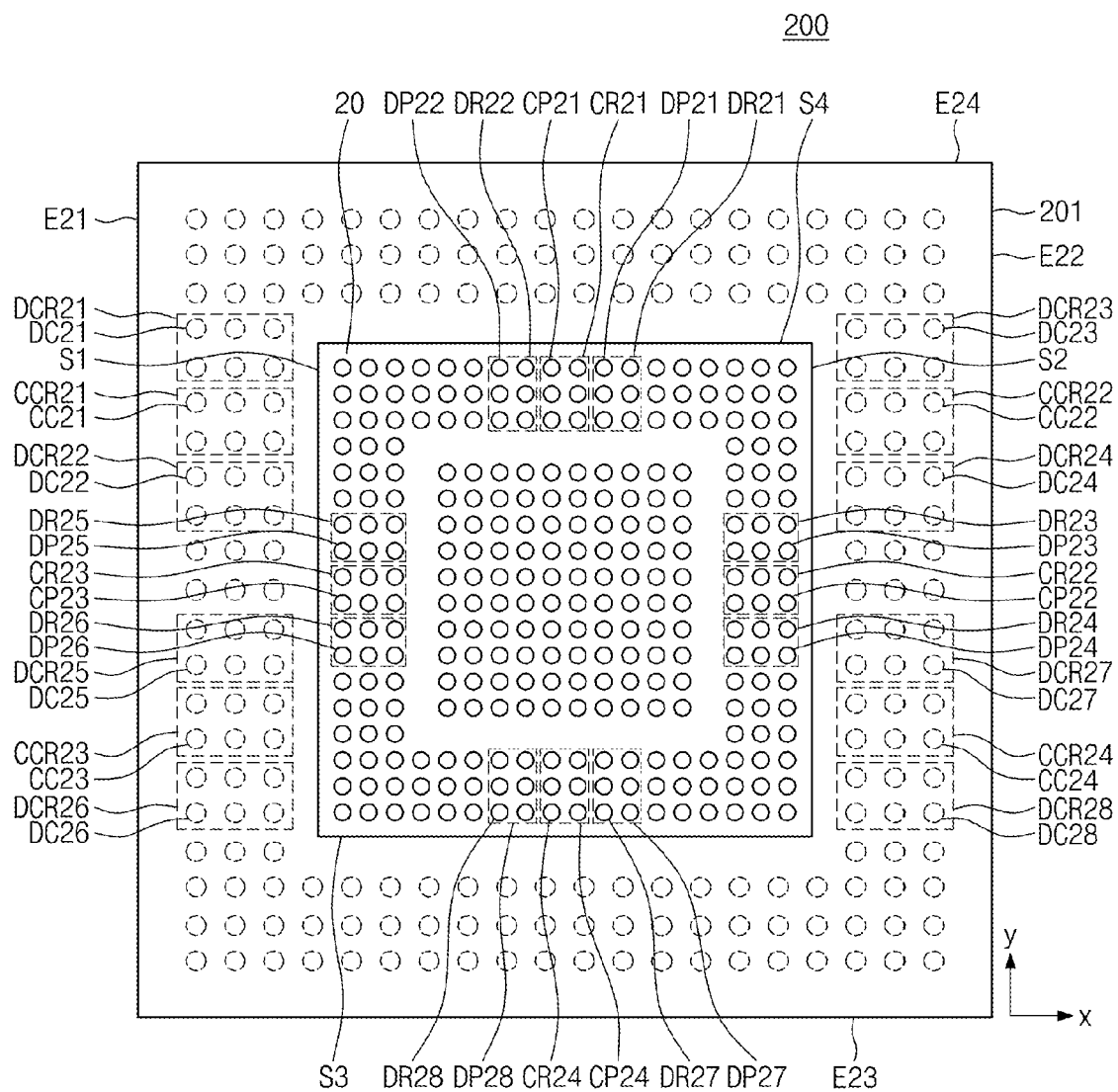
FIG. 10 is a plan view illustrating a second semiconductor package according to example embodiments of inventive concepts.

FIG. 10 is a plan view illustrating a second semiconductor package according to example embodiments of inventive concepts. For the sake of brevity, the elements and features of this example that are similar to those previously shown and described will not be described in much further detail.

Referring to FIG. 10, the logic chip 20 may include first to eighth data pad regions DR21-DR28, in which first to eighth data pads DP21-DP28, respectively, are disposed, and the first to fourth command/address pad regions CR21-CR24, in which the first to fourth command/address pads CP21-CP24, respectively, are disposed.

For example, the first and second data pad regions DR21 and DR22 and the first command/address pad region CR21 may be disposed adjacent to the fourth side surface S4. The seventh and eighth data pad regions DR27 and DR28 and the fourth command/address pad region CR24 may be disposed adjacent to the third side surface S3. In example embodiments, the first command/address pad region CR21 may be disposed between the first and second data pad regions DR21 and DR22. Similarly, the fourth command/address pad region CR24 may be disposed between the seventh and eighth data pad regions DR27 and DR28. Although not shown, in other example embodiments, the first and second data pad regions DR21 and DR22 and the first command/address pad region CR21 may be arranged along the x direction in the arrangement order of the first data pad region DR21/the second data pad region DR22/the first command/address pad region CR21. Similarly, the seventh and eighth data pad regions DR27 and DR28 and the fourth command/address pad region CR24 may be arranged along the x direction in the arrangement order of the seventh data pad region DR27/the eighth data pad region DR28/the fourth command/address pad region CR24.

The third and fourth data pad regions DR23 and DR24 and the second command/address pad region CR22 may be disposed adjacent to the second side surface S2. The fifth and sixth data pad regions DR25 and DR26 and a third command/address pad region CR23 may be disposed adjacent to the first side surface S1. The second command/address pad region CR22 may be disposed between the third and fourth data pad regions DR23 and DR24. Similarly, the third command/address pad region CR23 may be disposed between the fifth and sixth data pad regions DR25 and DR26. Although not shown, in other example embodiments, the third and fourth data pad regions DR23 and DR24 and the second command/address pad region CR22 may be arranged along the y direction in the arrangement order of the third data pad region DR23/the fourth data pad region DR24/the second command/address pad region CR22. Similarly, the fifth and sixth data pad regions DR25 and DR26 and the third command/address pad region CR23 may be arranged along the y direction in the arrangement order of the fifth data pad region DR25/the sixth data pad region DR26/the third command/address pad region CR23.

In example embodiments, the first and second data pads DP21 and DP22 and the first command/address pads CP21 may constitute the first channel, and the third and fourth data pads DP23 and DP24 and the second command/address pads CP22 may constitute the second channel. The fifth and sixth data pads DP25 and DP26 and the third command/address pads CP23 may constitute the third channel, and the seventh and eighth data pads DP27 and DP28 and the fourth command/address pads CP24 may constitute the fourth channel.

The second package substrate 201 may include the first to eighth DQ coupling pad regions DCR21-DCR28, in which the first to eighth DQ coupling pads DC1-DC8, respectively, are disposed, and the first to fourth CA coupling pad regions CCR21-CCR24, in which the first to fourth CA coupling pads CC1-CC4, respectively, are disposed. For example, the first and second DQ coupling pad regions DCR21 and DCR22 and the first CA coupling pad region CCR21 may be disposed adjacent to the first edge E21 of the second package substrate 201. By contrast, the third and fourth DQ coupling pad regions DCR23 and DCR24 and the second CA coupling pad region CCR22 may be disposed adjacent to the second edge E22. The first CA coupling pad region CCR21 may be disposed between the first and second DQ coupling pad regions DCR21 and DCR22. Similarly, the second CA coupling pad region CCR22 may be disposed between the third and fourth DQ coupling pad regions DCR23 and DCR24. Although not shown, in other example embodiments, the first and second DQ coupling pad regions DCR21 and DCR22 and the first CA coupling pad region CCR21 may be arranged along the y direction in the arrangement order of the first DQ coupling pad region DCR21/the second DQ coupling pad region DCR22/the first CA coupling pad region CCR21. Similarly, the third and fourth DQ coupling pad regions DCR23 and DCR24 and the second CA coupling pad region CCR22 may be arranged along the y direction in the arrangement order of the third DQ coupling pad region DCR23/the fourth DQ coupling pad region DCR24/the second CA coupling pad region CCR22.

The fifth and sixth DQ coupling pad regions DCR25 and DCR26 and the third CA coupling pad region CCR23 may be disposed spaced apart from the second DQ coupling pad region DCR22 in the y direction and adjacent to the first edge E21. The seventh and eighth DQ coupling pad regions DCR27 and DCR28 and the fourth CA coupling pad region CCR24 may be disposed spaced apart from the fourth DQ coupling pad region DCR24 in the y direction and adjacent to the second edge E22. The fifth and sixth DQ coupling pad regions DCR25 and DCR26 and the third CA coupling pad region CCR23 may be arranged to have the same arrangement order as that of the first and second DQ coupling pad regions DCR21 and DCR22 and the first CA coupling pad region CCR21. Similarly, the seventh and eighth DQ coupling pad regions DCR27 and DCR28 and the fourth CA coupling pad region CCR24 may be arranged to have the same arrangement order as that of the third and fourth DQ coupling pad regions DCR23 and DCR24 and the second CA coupling pad region CCR22.

The first to eighth data pads DP21-DP28 may be electrically connected to the first to eighth DQ coupling pads DC1-DC8, respectively, and the first to fourth command/address pads CP21-CP24 may be electrically connected to the first to fourth CA coupling pads CC1-CC4, respectively.

Figure 11:
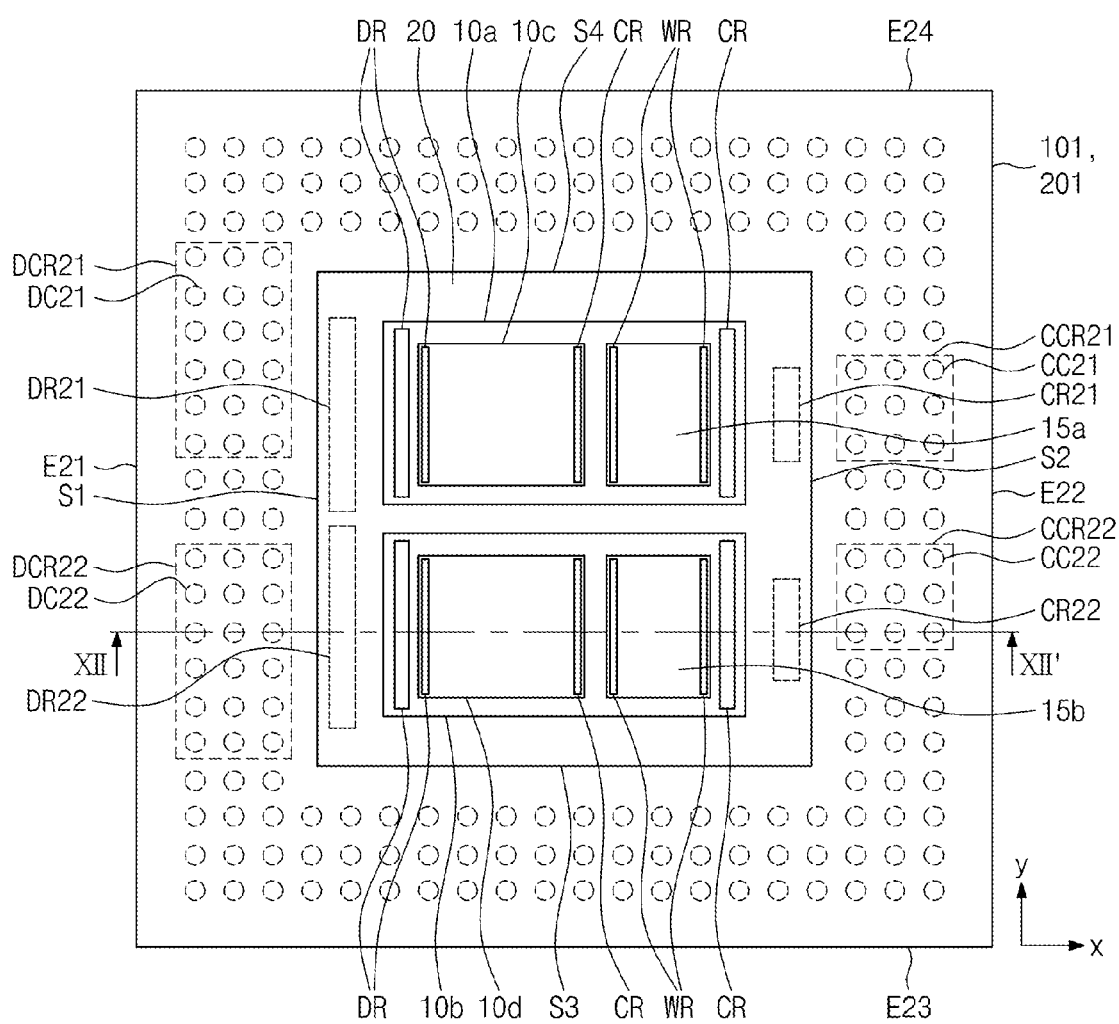
FIG. 11 is a schematic plan view illustrating a stack-type semiconductor package according to example embodiments of inventive concepts.
Figure 12:
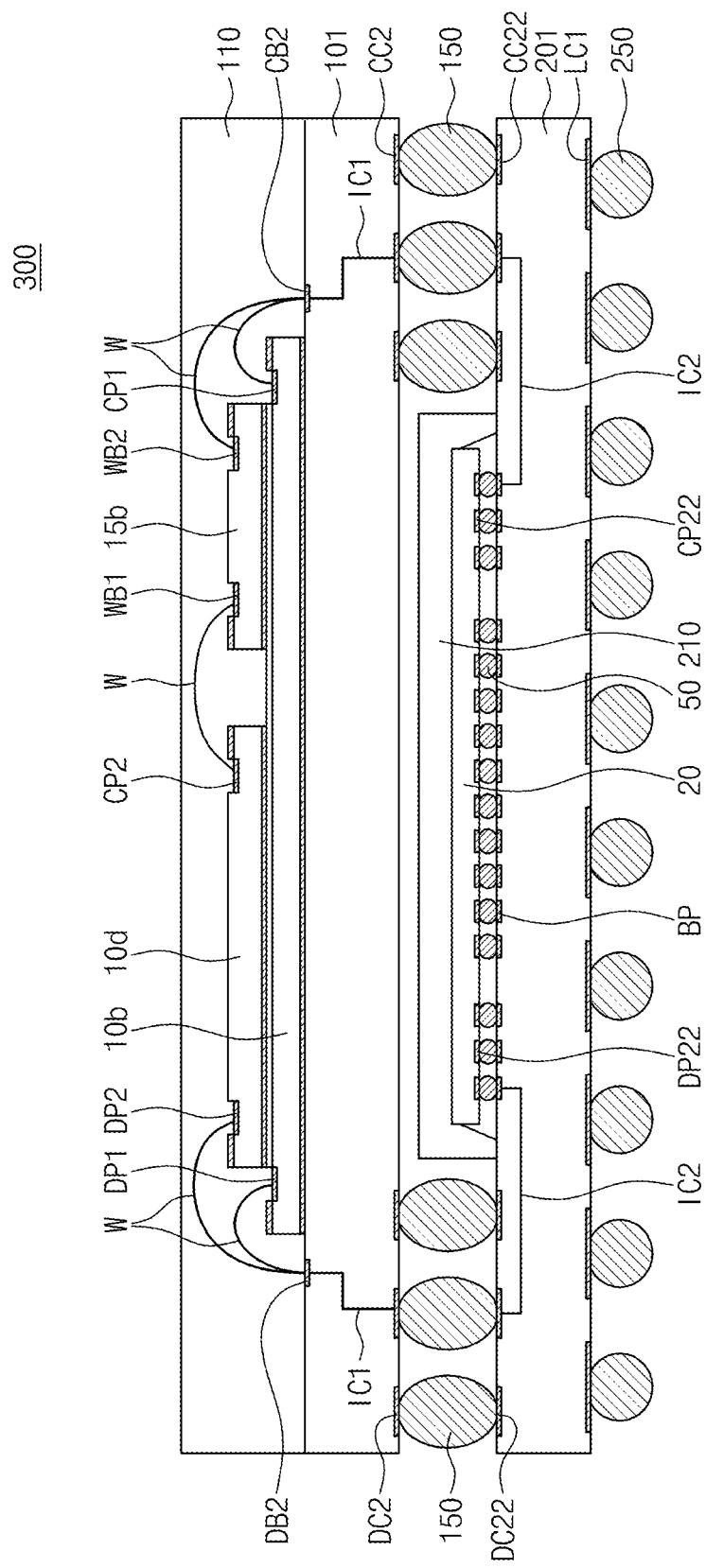
FIG. 12 is a sectional view taken along a line XII-XII' of FIG. 11 to illustrate a stack-type semiconductor package according to example embodiments of inventive concepts.

FIG. 11 is a schematic plan view illustrating a stack-type semiconductor package according to example embodiments of inventive concepts. FIG. 12 is a sectional view taken along a line XII-XII' of FIG. 11 to illustrate a stack-type semiconductor package according to example embodiments of inventive concepts.

Referring to FIGS. 11 and 12, a stack-type semiconductor package 300 may include the second semiconductor package 200 and the first semiconductor package 100 stacked thereon.

As described with reference to FIGS. 2 and 3, the first semiconductor package 100 may include the first and second memory chips 10a and 10b, which are disposed spaced apart from each other in the y direction, the third and fourth memory chips 10c and 10d, which are stacked on the first and second memory chips 10a and 10b, respectively, and the first and second jumper chips 15a and 15b, which are stacked on the first and second memory chips 10a and 10b, respectively, and be spaced apart from the third and fourth memory chips 10c and 10d, respectively. The second semiconductor package 200 may include the logic chip 20 having the first and second channels, as described with reference to FIGS. 5 and 6.

The first and second DQ coupling pads DC21 and DC22 of the second semiconductor package 200 may be electrically connected to the first and second DQ coupling pads DC1 and DC2 of the first semiconductor package 100 via the connection coupling terminals 150. The first and second CA coupling pads CC21 and CC22 of the second semiconductor package 200 may be electrically connected to the first and second CA coupling pads CC1 and CC2 of the first semiconductor package 100 via the connection coupling terminals 150. The stack-type semiconductor package 300 may be connected to external electronic devices through the external coupling terminals 250.

In example embodiments, the first semiconductor package 100 may be stacked on the second semiconductor package 200 in such a way that the first DQ coupling pads DC1 and DC21 and the first CA coupling pads CC1 and CC21 connected to the first and third memory chips 10a and 10c are disposed to face each other and the second DQ coupling pads DC2 and DC22 and the second CA coupling pads CC2 and CC22 connected to the second and fourth memory chips 10b and 10d are disposed to face each other. Accordingly, it is possible to simplify interconnection structures from the memory data pads DP1 of the first and second memory chips 10a and 10b to the first and second data pads DP21 and DP22 of the logic chip 20 and from the memory command/address pads CP1 of the first and second memory chips 10a and 10b to the first and second command/address pads CP21 and CP22 of the logic chip 20.

Furthermore, it is possible to reduce a signal transmission path from the memory data pads DP2 of the third and fourth memory chips 10c and 10d stacked on the first and second memory chips 10a and 10b to the first and second data pads DP21 and DP22 of the logic chip 20. In addition, the memory command/address pads CP2 of the third and fourth memory chips 10c and 10d may be connected to the first and second command/address pads CP21 and CP22 of the logic chip 20 through the wire bonding pads WB1 and WB2 of the first and second jumper chips 15a and 15b.

Further, the first and second memory chips 10a and 10b may be disposed side by side in the first semiconductor package 100, and the third and fourth memory chips 10c and 10d may be stacked on the first and second memory chips 10a and 10b, respectively. Accordingly, it is possible to reduce a vertical thickness of the stack-type semiconductor package 300. The third and fourth memory chips 10c and 10d may have a memory capacity that is half that of each of the first and second memory chips 10a and 10b, and thus, the semiconductor package can have a memory capacity that is odd-number times larger than the first or second memory chip.

Figure 13:
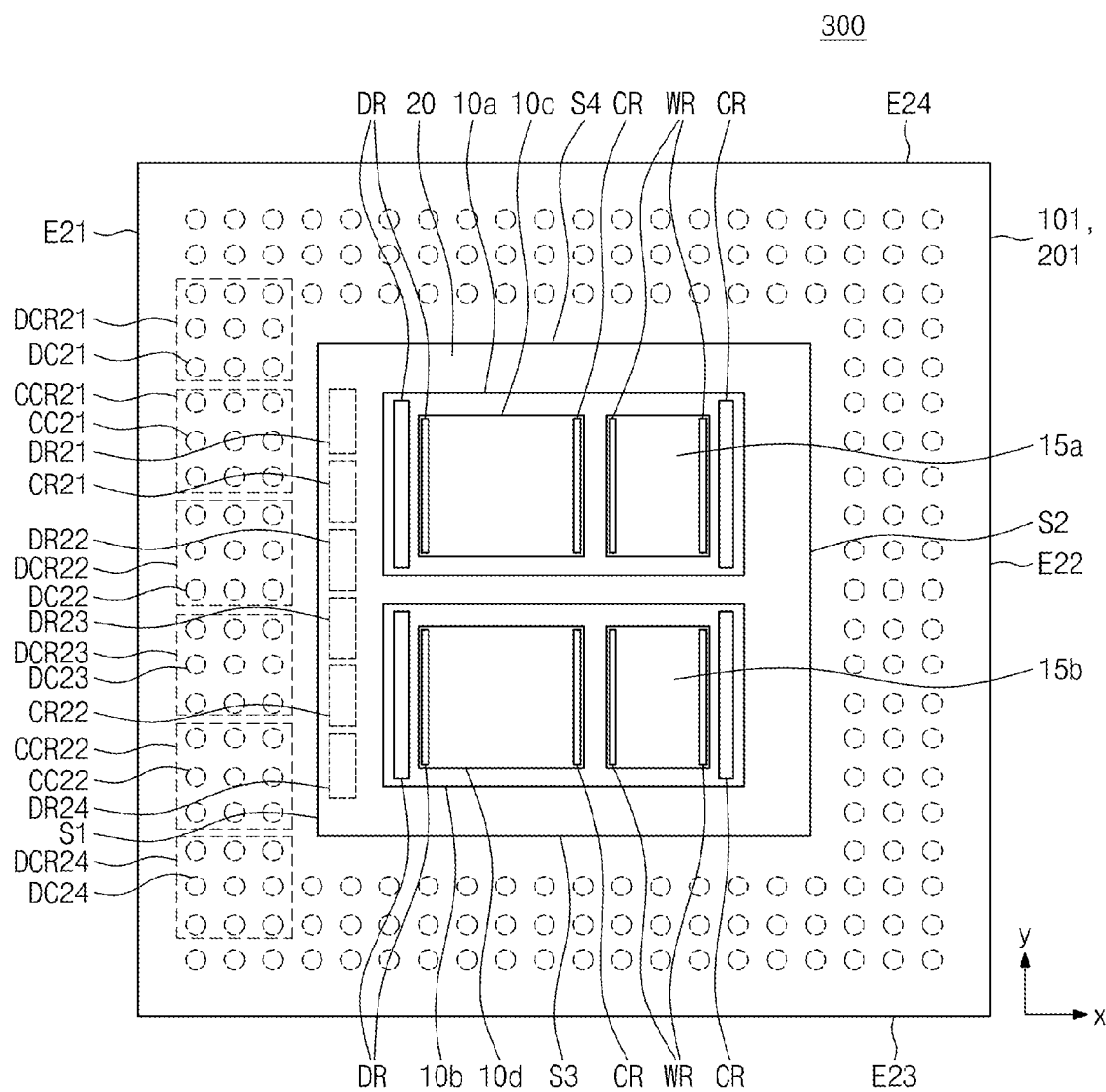
FIG. 13 is a schematic plan view illustrating a stack-type semiconductor package according to example embodiments of inventive concepts.

FIG. 13 is a schematic plan view illustrating a stack-type semiconductor package according to example embodiments of inventive concepts. For the sake of brevity, the elements and features of this example that are similar to those previously shown and described will not be described in much further detail.

Referring to FIG. 13, the stack-type semiconductor package 300 may include the second semiconductor package 200 and the first semiconductor package 100 stacked thereon.

As described with reference to FIGS. 2 and 3, the first semiconductor package 100 may include the first and second memory chips 10a and 10b, which are disposed spaced apart from each other in the y direction, the third and fourth memory chips 10c and 10d, which are stacked on the first and second memory chips 10a and 10b, respectively, and the first and second jumper chips 15a and 15b, which are stacked on the first and second memory chips 10a and 10b, respectively, and be spaced apart from the third and fourth memory chips 10c and 10d, respectively.

As described with reference to FIG. 7, the second semiconductor package 200 may include the logic chip 20, in which the first to fourth data pad regions DR21, DR22, DR23, and DR24 and the first and second command/address pad regions CR21 and CR22 are disposed adjacent to the first side surface S1. For example, the first CA coupling pad region CCR21 may be disposed between the first and second data regions DCR21 and DCR22, and the second CA coupling pad region CCR22 may be disposed between the third and fourth data regions DCR23 and DCR24.

The first to fourth data pads DP21-DP24 and the first and second command/address pads CP21 and CP22 of the logic chip 20 may be electrically connected to the memory data pads DP1 and DP2 and the memory command/address pads CP1 and CP2, which may be disposed in each of the first to fourth memory chips 10a-10d of the first semiconductor package 100, via the coupling pads DC21-DC24, CC21, and CC22, the internal lines IC2 (e.g., of FIG. 12), and the connection coupling terminals 150 (e.g., of FIG. 12). For example, the first and second data pads DP21 and DP22 and the first command/address pads CP21 may be electrically connected to the memory data pads DP1 and DP2 and the memory command/address pads CP1 and CP2, respectively, of the first and third memory chips 10a and 10c. The third and fourth data pads DP23 and DP24 and the second command/address pads CP22 may be electrically connected to the memory data pads DP1 and DP2 and the memory command/address pads CP1 and CP2, respectively, of the second and fourth memory chips 10b and 10d.

All of the first to fourth data pads DP21-DP24 and the first and second command/address pads CP21 and CP22 of the logic chip 20 may be disposed adjacent to one side surface of the logic chip 20, and thus, they are positioned adjacent to the memory data pads DP1 and DP2 of the first to fourth memory chips 10a-10d, when viewed in plan view. This makes it possible to improve efficiency in design of the logic chip and reduce a data latency.

Although not shown, the first to fourth data pads DP21-DP24 and the first and second command/address pads CP21 and CP22 of the logic chip 20 may be arranged to have the same arrangement order as that described with reference to FIG. 7, and thus, the arrangement of the coupling pads DC21-DC24, CC21, and CC22 may be changed.

Figure 14:
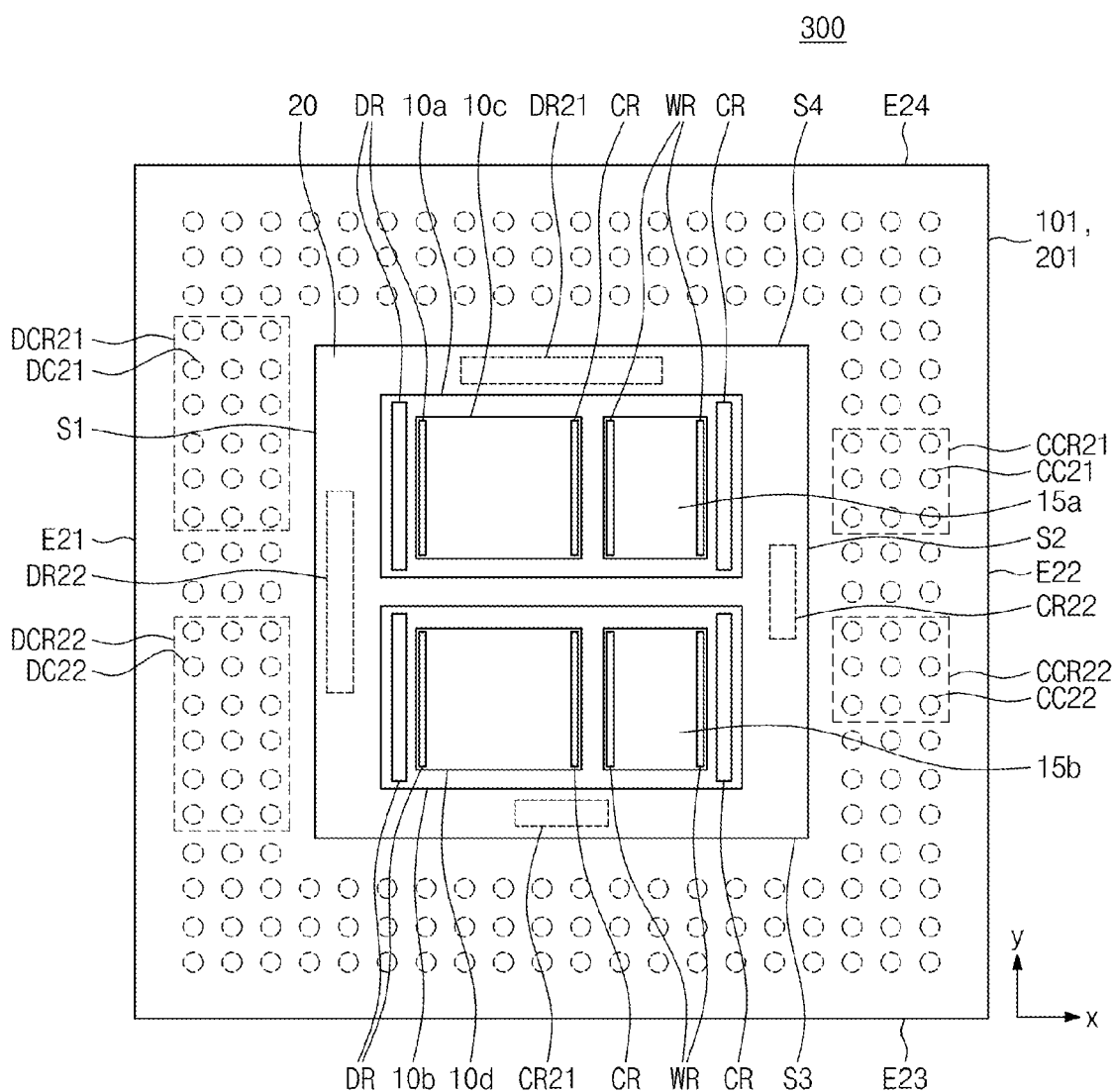
FIG. 14 is a schematic plan view illustrating a stack-type semiconductor package according to example embodiments of inventive concepts.

FIG. 14 is a schematic plan view illustrating a stack-type semiconductor package according to example embodiments of inventive concepts. For the sake of brevity, the elements and features of this example that are similar to those previously shown and described will not be described in much further detail.

Referring to FIG. 14, the stack-type semiconductor package 300 may include the second semiconductor package 200 and the first semiconductor package 100 stacked thereon.

As described with reference to FIGS. 2 and 3, the first semiconductor package 100 may include the first and second memory chips 10a and 10b, which are disposed spaced apart from each other in the y direction, the third and fourth memory chips 10c and 10d, which are stacked on the first and second memory chips 10a and 10b, respectively, and the first and second jumper chips 15a and 15b, which are stacked on the first and second memory chips 10a and 10b, respectively, and be spaced apart from the third and fourth memory chips 10c and 10d, respectively.

As described with reference to FIG. 8, the second semiconductor package 200 may include the logic chip 20, in which the first data pad region DR21 and the first command/address pad region CR21 are disposed near the fourth and third side surfaces S4 and S3, respectively, to face each other, and the second data pad region DR22 and the second command/address pad region CR22 are disposed near the first and second side surfaces S1 and S2, respectively, to face each other.

The first and second data pads DP21 and DP22 and the first and second command/address pads CP21 and CP22 of the logic chip 20 may be electrically connected to the memory data pads DP1 and DP2 and the memory command/address pads CP1 and CP2, which may be disposed in each of the first to fourth memory chips 10a-10d of the first semiconductor package 100, via the coupling pads DC21, DC22, CC21, and CC22, the internal lines IC2 (e.g., of FIG. 12), and the connection coupling terminals 150 (e.g., of FIG. 12). For example, the first data pads DP21 and the first command/address pads CP21 may be electrically connected to the memory data pads DP1 and DP2 and the memory command/address pads CP1 and CP2, respectively, of the first and third memory chips 10a and 10c. The second data pads DP22 and the second command/address pads CP22 may be electrically connected to the memory data pads DP1 and DP2 and the memory command/address pads CP1 and CP2, respectively, of the second and fourth memory chips 10b and 10d.

Figure 15:
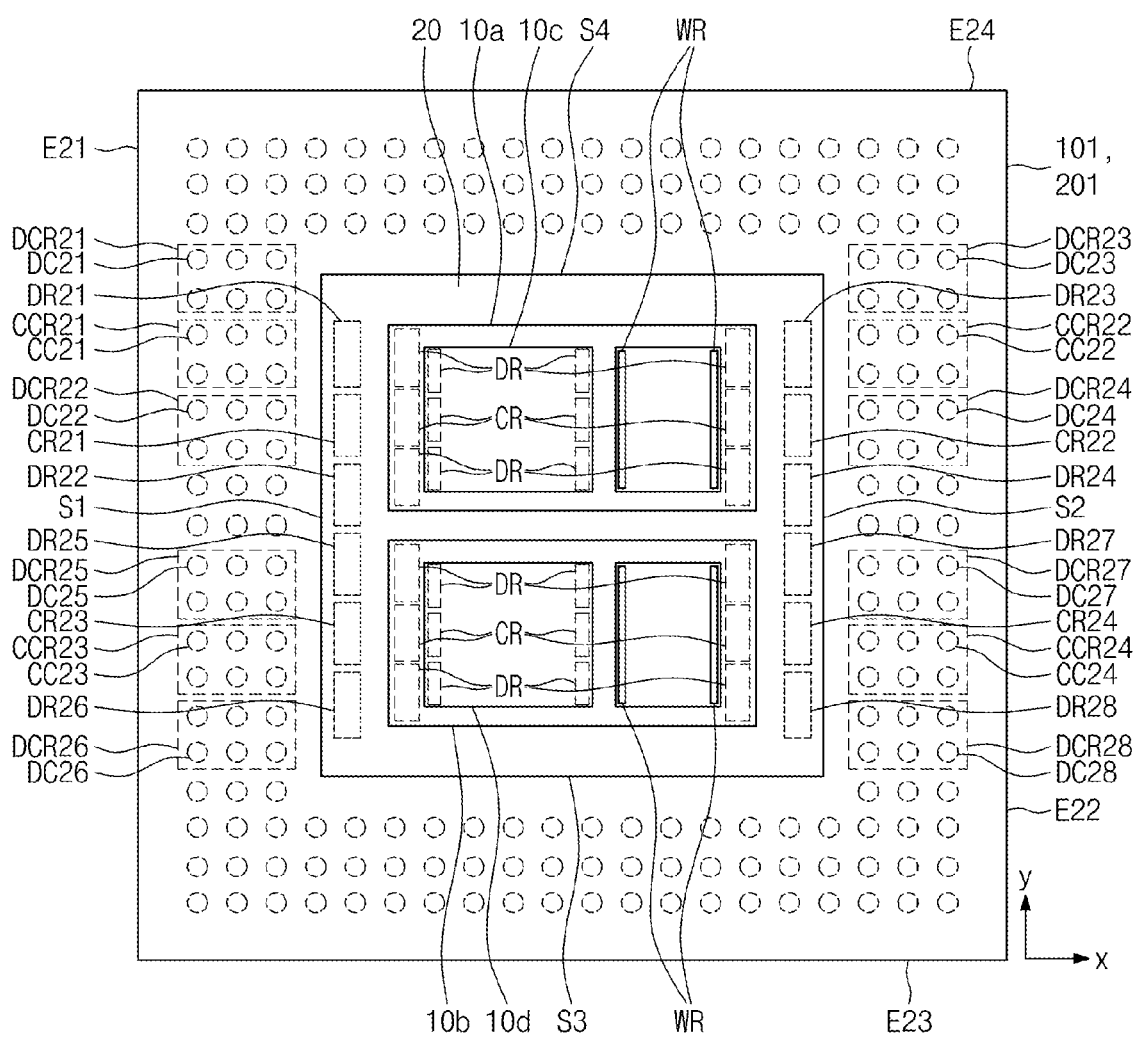
FIG. 15 is a schematic plan view illustrating a stack-type semiconductor package according to example embodiments of inventive concepts.

FIG. 15 is a schematic plan view illustrating a stack-type semiconductor package according to example embodiments of inventive concepts. For the sake of brevity, the elements and features of this example that are similar to those previously shown and described will not be described in much further detail.

Referring to FIG. 15, the stack-type semiconductor package 300 may include the second semiconductor package 200 and the first semiconductor package 100 stacked thereon.

As described with reference to FIG. 4, the first semiconductor package 100 may include the first and second memory chips 10a and 10b, which are disposed spaced apart from each other in the y direction, the third and fourth memory chips 10c and 10d, which are stacked on the first and second memory chips 10a and 10b, respectively, and the first and second jumper chips 15a and 15b, which are stacked on the first and second memory chips 10a and 10b, respectively, and be spaced apart from the third and fourth memory chips 10c and 10d, respectively.

As described with reference to FIG. 9, the second semiconductor package 200 may include the logic chip 20, in which the first, second, fifth, and sixth data pad regions DR21, DR22, DR25, and DR26 and the first and third command/address pad region CR21 and CR23 are disposed adjacent to the first side surface S1, and the third, fourth, seventh, and eighth data pad regions DR23, DR24, DR27, and DR28 and the second and fourth command/address pad region CR22 and CR24 are disposed adjacent to the second side surface S2.

The first to eighth data pads DP21-DP28 and the first to fourth command/address pads CP21-CP242 of the logic chip 20 may be electrically connected to the memory data pads DP1-DP8 and the memory command/address pads CP1-CP4, which are provided in each of the first to fourth memory chips 10a-10d of the first semiconductor package 100, through the coupling pads DC21-DC28 and CC21-CC24, the internal lines IC2 (e.g., of FIG. 12), and the connection coupling terminals 150 (e.g., of FIG. 12).

For example, the first and second data pads DP21 and DP22 and the first command/address pads CP21 may be electrically connected to the memory data pads DP1, DP2, DP5, and DP6 and the memory command/address pads CP1 and CP3, respectively, of the first and third memory chips 10a and 10c. The third and fourth data pads DP23 and DP24 and the second command/address pads CP22 may be electrically connected to the memory data pads DP3, DP4, DP7, and DP8 and the memory command/address pads CP2 and CP4, respectively, of the first and third memory chips 10a and 10c. The fifth and sixth data pads DP25 and DP26 and the third command/address pads CP23 may be electrically connected to the memory data pads DP1, DP2, DP5, and DP6 and the memory command/address pads CP1 and CP3, respectively, of the second and fourth memory chips 10b and 10d. The seventh and eighth data pads DP27 and DP28 and the fourth command/address pads CP24 may be electrically connected to the memory data pads DP3, DP4, DP7, and DP8 and the memory command/address pads CP2 and CP4, respectively, of the second and fourth memory chips 10b and 10d.

Figure 16:
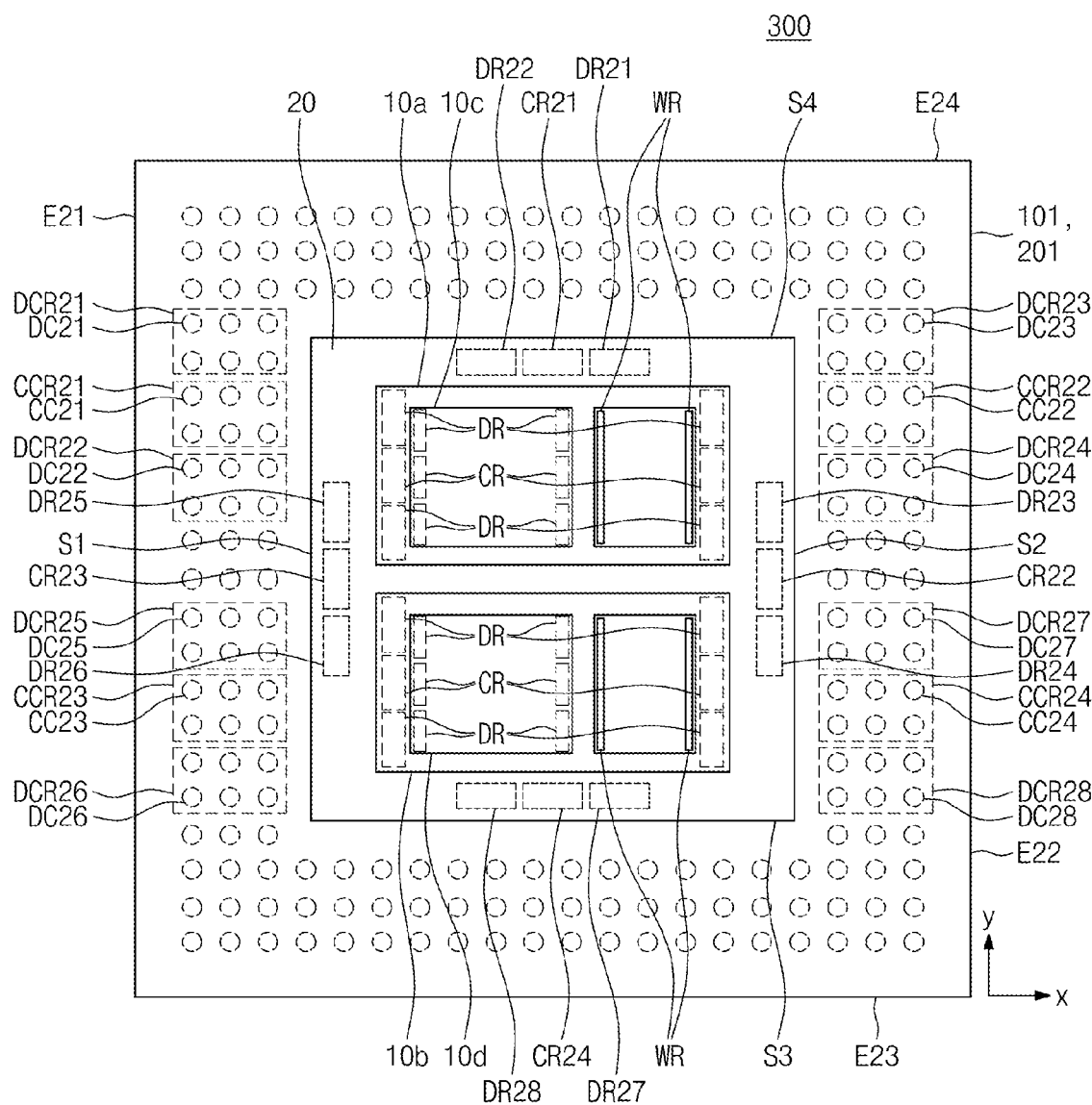
FIG. 16 is a schematic plan view illustrating a stack-type semiconductor package according to example embodiments of inventive concepts.

FIG. 16 is a schematic plan view illustrating a stack-type semiconductor package according to example embodiments of inventive concepts. For the sake of brevity, the elements and features of this example that are similar to those previously shown and described will not be described in much further detail.

Referring to FIG. 16, the stack-type semiconductor package 300 may include the second semiconductor package 200 and the first semiconductor package 100 stacked thereon.

As described with reference to FIG. 4, the first semiconductor package 100 may include the first and second memory chips 10a and 10b, which are disposed spaced apart from each other in the y direction, the third and fourth memory chips 10c and 10d, which are stacked on the first and second memory chips 10a and 10b, respectively, and the first and second jumper chips 15a and 15b, which are stacked on the first and second memory chips 10a and 10b, respectively, and be spaced apart from the third and fourth memory chips 10c and 10d, respectively.

As described with reference to FIG. 10, the second semiconductor package 200 may include the logic chip 20, in which the first and second data pad regions DR21 and DR22 and the first command/address pad region CR21 are disposed adjacent to the fourth side surface S4, the third and fourth data pad regions DR23 and DR24 and the second command/address pad region CR22 are disposed adjacent to the second side surface S2, the fifth and sixth data pad regions DR25 and DR26 and the third command/address pad region CR23 are disposed adjacent to the first side surface S1, and the seventh and eighth data pad regions DR27 and DR28 and the fourth command/address pad region CR24 are disposed adjacent to the third side surface S3.

The first to eighth data pads DP21-DP28 and the first to fourth command/address pads CP21-CP242 of the logic chip 20 may be electrically connected to the memory data pads DP1-DP8 and the memory command/address pads CP1-CP4, which are provided in each of the first to fourth memory chips 10a-10d of the first semiconductor package 100, through the coupling pads DC21-DC28 and CC21-CC24, the internal lines IC2 (e.g., of FIG. 12), and the connection coupling terminals 150 (e.g., of FIG. 12).

For example, the first and second data pads DP21 and DP22 and the first command/address pads CP21 may be electrically connected to the memory data pads DP1, DP2, DP5, and DP6 and the memory command/address pads CP1 and CP3 of the first and third memory chips 10a and 10c. The third and fourth data pads DP23 and DP24 and the second command/address pads CP22 may be electrically connected to the memory data pads DP3, DP4, DP7, and DP8 and the memory command/address pads CP2 and CP4 of the first and third memory chips 10a and 10c. The fifth and sixth data pads DP25 and DP26 and the third command/address pads CP23 may be electrically connected to the memory data pads DP1, DP2, DP5, and DP6 and the memory command/address pads CP1 and CP3 of the second and fourth memory chips 10b and 10d. The seventh and eighth data pads DP27 and DP28 and the fourth command/address pads CP24 may be electrically connected to the memory data pads DP3, DP4, DP7, and DP8 and the memory command/address pads CP2 and CP4 of the second and fourth memory chips 10b and 10d.

Figure 17:
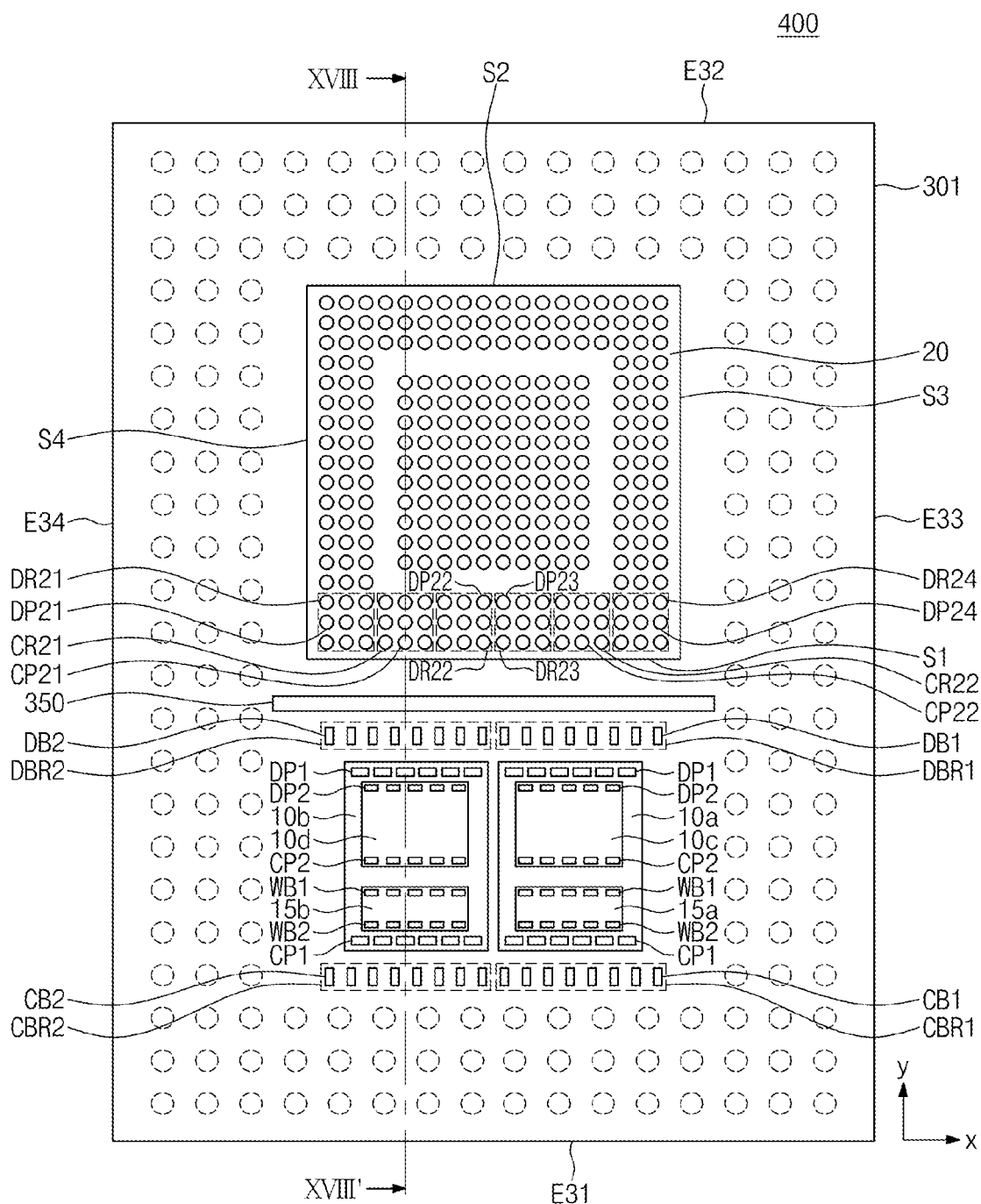
FIG. 17 is a schematic plan view illustrating a planar-type semiconductor package according to example embodiments of inventive concepts.
Figure 18:
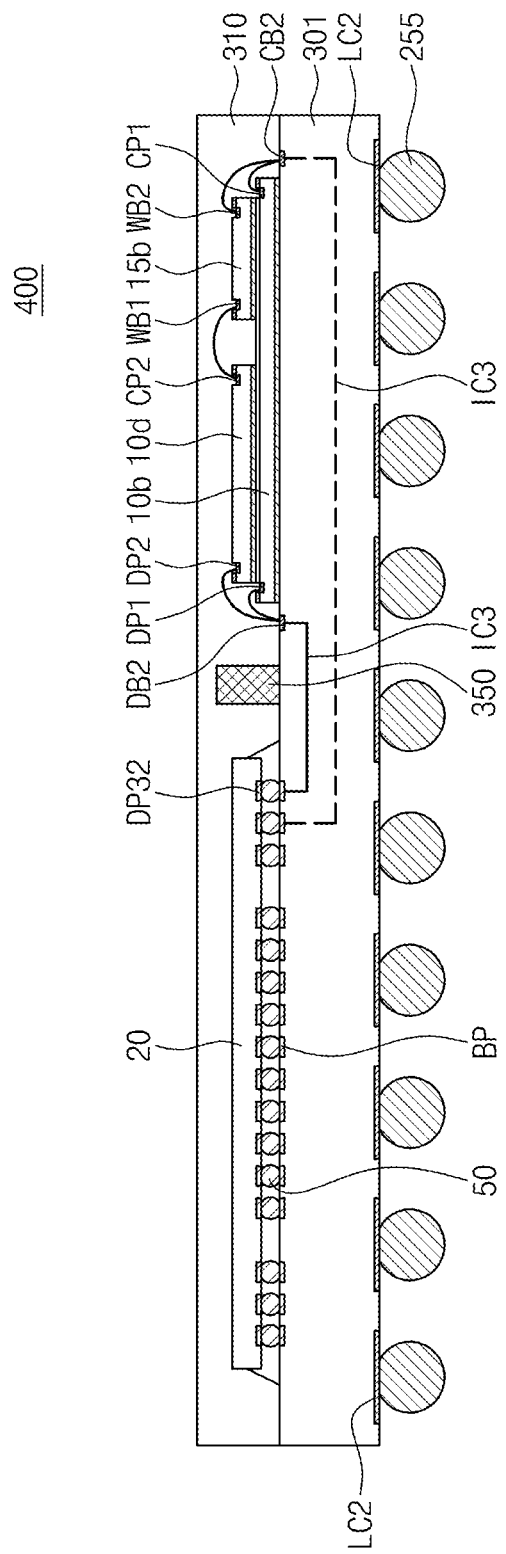
FIG. 18 is a sectional view taken along a line XVIII-XVIII' of FIG. 17 to illustrate a planar-type semiconductor package according to example embodiments of inventive concepts.

FIG. 17 is a schematic plan view illustrating a planar-type semiconductor package according to example embodiments of inventive concepts. FIG. 18 is a sectional view taken along a line XVIII-XVIII' of FIG. 17 to illustrate a planar-type semiconductor package according to example embodiments of inventive concepts.

Referring to FIGS. 17 and 18, a planar-type semiconductor package 400 may include the first to fourth memory chips 10a-10d, the first and second jumper chips 15a and 15b, and the logic chip 20 mounted on a third package substrate 301.

The first to fourth memory chips 10a-10d may be configured to have the same features as the first to fourth memory chips 10a-10d of FIGS. 2 and 3. The first and second jumper chips 15a and 15b may be configured to have the same features as the first and second jumper chips 15a and 15b of FIGS. 2 and 3. The logic chip 20 may be configured to have the same features as the logic chip 20 of FIG. 7.

The first to fourth memory chips 10a-10d and the first and second jumper chips 15a and 15b may be disposed on the third package substrate 300, as described with reference to FIGS. 2 and 3.

As described with reference to FIG. 6, the logic chip 20 may include the first to fourth data pad regions DR21, DR22, DR23, and DR24 and the first and second command/address pad regions CR21 and CR22 disposed adjacent to the first side surface S1. For example, the first command/address pad region CR21 may be disposed between the first and second data pad regions DR21 and DR22, and the second command/address region pad CR22 may be disposed between the third and fourth data pad regions DR23 and DR24. The first to fourth data pads DP21-DP24 and the first and second command/address pads CP21 and CP22 may be disposed in the first to fourth data pad regions DR21-DR24 and the first and second command/address pad regions CR21 and CR22, respectively.

The first to fourth memory chips 10a-10d may be mounted on the third package substrate 301 in a wire bonding manner, and the logic chip 20 may be mounted on the third package substrate 301 in a flip chip bonding manner. The memory data pads DP1 and DP2 of the first to fourth memory chips 10a-10d may be disposed adjacent to and parallel to the first side surface S1 of the logic chip 20.

The third package substrate 301 may include the bonding pads BP, DB1, DB2, CB1, and CB2, external coupling pads LC2, and internal lines IC3. The bonding pads BP, DB1, DB2, CB1, and CB2 may be arranged on the top surface of the third package substrate 301, and the external coupling pads LC2 may be arranged on the bottom surface of the third package substrate 301. The bonding pads BP may be provided on a central region of the third package substrate 301, on which the logic chip 20 is mounted. Further, each of the first and second DQ bonding pads DB1 and DB2 may be disposed adjacent to the memory data pads DP1 of the first and second memory chips 10a and 10b, and each of the first and second CA bonding pads CB1 and CB2 may be disposed adjacent to the memory command/address pads CP1 of the first and second memory chips 10a and 10b.

The first to fourth memory chips 10a-10d and the logic chip 20 may be connected to each other through the internal lines IC3. For example, the memory data pads DP1 and DP2 of the first and third memory chips 10a and 10c may be electrically connected to the third and fourth data pads DP23 and DP24 of the logic chip 20 via the first DQ bonding pads DB1 and the internal lines IC3. The memory command/address pads CP1 and CP2 of the first and third memory chips 10a and 10c may be electrically connected to the second command/address pads CP22 of the logic chip 20 via the first CA bonding pads CB1, the first and second wire bonding pads WB1 and WB2 and/or the internal lines IC3.

Similarly, the memory data pads DP1 and DP2 of the second and fourth memory chips 10b and 10d may be electrically connected to the first and second data pads DP21 and DP22 of the logic chip 20 via the second DQ bonding pads DB2 and the internal lines IC3. The memory command/address pads CP1 and CP2 of the second and fourth memory chips 10b and 10d may be electrically connected to the first command/address pads CP21 of the logic chip 20 via the second CA bonding pads CB2, the first and second wire bonding pads WB1 and WB2, and/or the internal lines IC3.

All of the first to fourth data pads DP21-DP24 and the first and second command/address pads CP21 and CP22 of the logic chip 20 may be disposed adjacent to one side surface of the logic chip 20, and thus, they are positioned adjacent to the memory data pads DP1 and DP2 of the first to fourth memory chips 10a-10d, when viewed in plan view. This makes it possible to improve efficiency in design of the logic chip and reduce a data latency.

The planar-type semiconductor package 400 may include a third molding layer 310 covering the memory chips 10a-10d and the logic chip 20. The third molding layer 310 may be provided between the third package substrate 301 and the memory chips 10a-10d and between the third package substrate 301 and the logic chip 20 to fill a gap region therebetween. For example, the third molding layer 310 may serve as an under-fill layer. A dam 350 may be provided between the memory chips 10a-10d and the logic chip 20 to limit (and/or prevent) resin solution from flowing when the third molding layer 310 is formed. The third molding layer 310 may include an epoxy molding compound.

Figure 19:
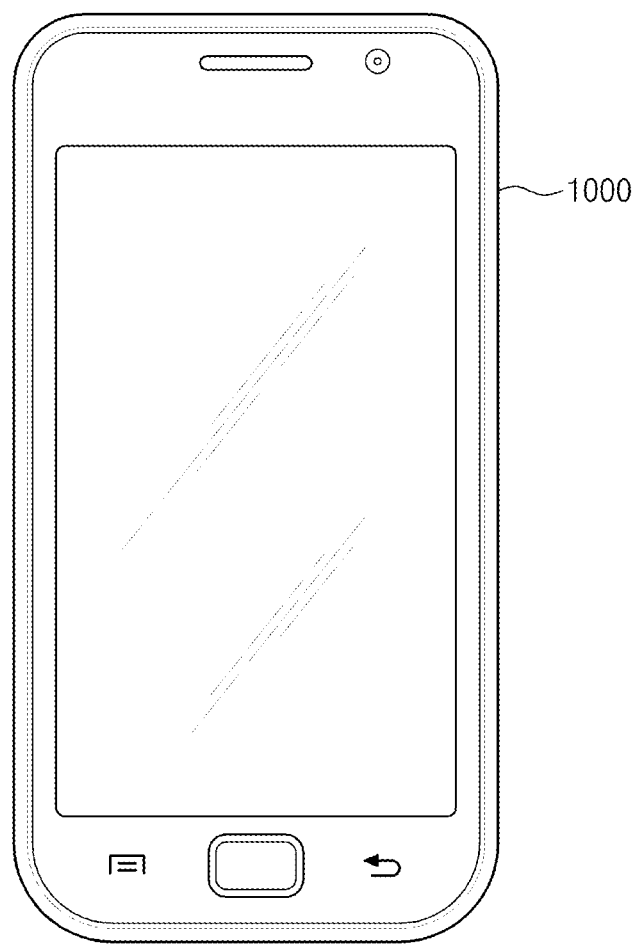
FIG. 19 is a diagram illustrating an example of electronic devices including a semiconductor package according to example embodiments of inventive concepts.
Figure 20:
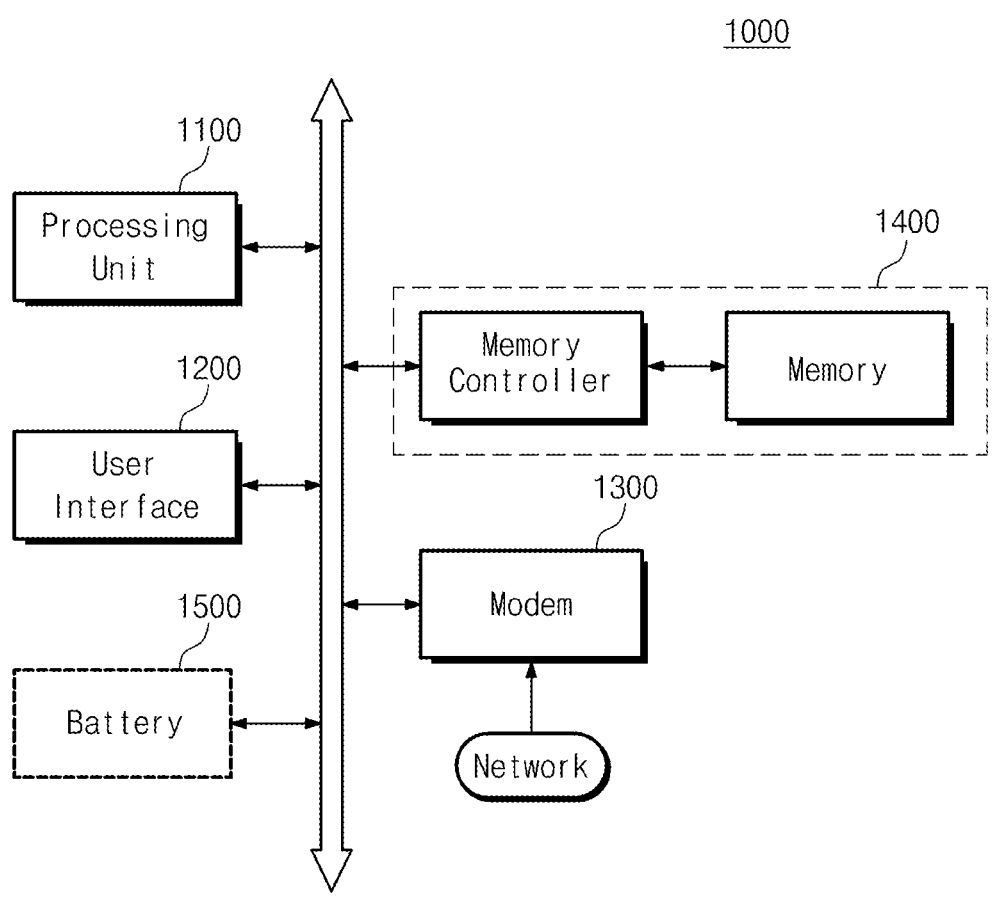
FIG. 20 is a schematic block diagram illustrating an electronic system including a semiconductor package according to example embodiments of inventive concepts.

FIG. 19 is a diagram illustrating an example of electronic devices including a semiconductor package according to example embodiments of inventive concepts. FIG. 20 is a schematic block diagram illustrating an electronic system including a semiconductor package according to example embodiments of inventive concepts.

Referring to FIG. 19, the semiconductor package according to example embodiments of inventive concepts may be used to realize a mobile phone 1000. Alternatively, the semiconductor package according to example embodiments of inventive concepts may be used to realize a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

Referring to FIG. 20, an electronic device 1000 according to example embodiments of inventive concepts may include a micro-processor 1100, a user interface 1200, a modem 1300 (e.g., a baseband chipset), and a semiconductor package 1400, which may be configured to have the same features as those previously described with reference to FIGS. 1 through 18.

In the case where the electronic device 1000 is provided for the mobile application, the electronic device 1000 may further include a battery 1500. Further, although not shown, the electronic device 1000 may further include other electronic components, such as an application chipset and a camera image processor (CIS), as will be obvious to skilled persons in the art.

According to example embodiments of inventive concepts, the semiconductor package may include first and second memory chips disposed side by side on a package substrate and third and fourth memory chips disposed on the first and second memory chips, respectively. Each of the first and second memory chips may have a memory capacity that is twice that of each of the third and fourth memory chips. Accordingly, it is possible to reduce a vertical thickness of the semiconductor package and realize the semiconductor package having memory capacity that is odd-number times larger than the third or fourth memory chip.

In example embodiments of inventive concepts, a first semiconductor package with a memory chip and a second semiconductor package with a logic chip may be stacked in such a way that command/address pads of the logic and memory chips are adjacent to each other, when viewed in plan view. This makes it possible to reduce a signal transmission distance and thereby increase a signal transmission speed.

Accordingly, semiconductor packages according to example embodiments of inventive concepts can have an increased operation speed.

In example embodiments of inventive concepts, a first semiconductor package with a memory chip and a second semiconductor package with a logic chip may be stacked in such a way that data pads and command/address pads of the logic chip are disposed adjacent to data pads of the memory chip, when viewed in plan view. This makes it possible to improve efficiency in design of the logic chip and reduce data latency.

While some example embodiments of inventive concepts have been particularly shown and described, it will be understood by one of ordinary skill in the art that variations in form and detail may be made therein without departing from the spirit and scope of the claims.

What is claimed is:

1. A semiconductor package, comprising:
    a first semiconductor package including,
        a first package substrate,
        first and second memory chips on the first package substrate, the first and second memory chips spaced apart from each other in a first direction,
        third and fourth memory chips on the first and second memory chips, respectively, and
        first and second jumper chips on the first and second memory chips, respectively, the first and second jumper chips spaced apart from the third and fourth memory chips, respectively, in a second direction crossing the first direction; and
    a second semiconductor package, the first semiconductor package on the second semiconductor package, the second semiconductor package including,
        a second package substrate, and
        a logic chip on the second package substrate.

2. The semiconductor package of claim 1, wherein
the first package substrate includes first and second edges facing each other,
each of the first to fourth memory chips include memory data pads and memory command/address pads, which are electrically connected to the logic chip,
the memory data pads and the memory command/address pads in each of the first to fourth memory chips, respectively, are spaced apart from each other in the second direction, and
the memory data pads and the memory command/address pads in each of the first to fourth memory chips, respectively, are arranged parallel to the first edge.

3. The semiconductor package of claim 2, wherein
the second package substrate includes first data pin (DQ) coupling pads, second data pin (DQ) coupling pads, first command/address (CA) coupling pads, and second command/address (CA) coupling pads,
the first DQ coupling pads and the first CA coupling pads face each other and are electrically connected to the first and third memory chips,
the second DQ coupling pads and the second CA coupling pads face each other and are electrically connected to the second and fourth memory chips, and
when viewed in a plan view,
the first and second DQ coupling pads are adjacent to the memory data pads of the first to fourth memory chips, and
the first and second CA coupling pads are adjacent to the memory command/address pads of the first to fourth memory chips.

4. The semiconductor package of claim 3, wherein
the logic chip includes first data pads, second data pads, first command/address pads, and second command/address pads,
the first data pads and the first command/address pads are electrically connected to the first and third memory chips,
the first data pads and the first command/address pads face each other,
the second data pads and the second command/address pads are electrically connected to the second and fourth memory chips,
the second data pads and the second command/address pads face each other,
the first and second data pads are adjacent to the first and second DQ coupling pads, respectively, and
the first and second command/address pads are adjacent to the first and second CA coupling pads, respectively.

5. The semiconductor package of claim 3, wherein
the logic chip includes first data pads, second data pads, first command/address pads, second command/address pads, a first side surface, and a second side surface,
the first data pads and the first command/address pads are electrically connected to the first and third memory chips,
the first data pads and the first command/address pads face each other,
the second data pads and the second command/address pads are electrically connected to the second and fourth memory chips,
the second data pads and the second command/address pads face each other,
the first and second side surfaces are adjacent to each other,
the first data pads are adjacent to the first side surface,
the second data pads are adjacent to the second side surface, and
when viewed in a plan view, the second data pads are adjacent to the memory data pads of the first to fourth memory chips.

6. The semiconductor package of claim 2, wherein
the second package substrate includes first to fourth data pin (DQ) coupling pads, first command/address (CA) coupling pads, and second command/address (CA) coupling pads along one side surface of the second package substrate,
the first DQ coupling pads, the second DQ coupling pads, and the first CA coupling pads are electrically connected to the first and third memory chips,
the third DQ coupling pads, the fourth DQ coupling pads, and the second CA coupling pads are electrically connected to the second and fourth memory chips,
the first CA coupling pads are between the first and second DQ coupling pads, and
the second CA coupling pads are between the third and fourth DQ coupling pads.

7. The semiconductor package of claim 6, wherein
the logic chip includes first to fourth data pads, first command/address pads, and second command/address pads along one side surface of the logic chip,
the first data pads, the second data pads, and the first command/address pads are electrically connected to the first and third memory chips,
the third data pads, the fourth data pads, and the second command/address pads are electrically connected to the second and fourth memory chips,
the first to fourth data pads are adjacent to the first to fourth DQ coupling pads, respectively, and the first and second command/address pads are adjacent to the first and second CA coupling pads, respectively.

8. The semiconductor package of claim 1, wherein
each of the first to fourth memory chips include first to fourth memory data pads, first memory command/address pads, and second memory command/address pads,
the first memory data pads, the second memory data pads, and the first memory command/address pads are adjacent to a side of the semiconductor package,
the third memory data pads, the fourth memory data pads, and the second memory command/address pads are adjacent to an opposite side of the semiconductor package, the first memory command/address pads are between the first and second memory data pads, and the second memory command/address pads are between the third and fourth memory data pads.

9. The semiconductor package of claim 8, wherein
the second package substrate includes first to eighth data pin (DQ) coupling pads, and first to fourth command/address (CA) coupling pads,
the first to fourth DQ coupling pads, the first CA coupling pads, and the second CA coupling pads are electrically connected to the first and third memory chips,
the fifth to eighth DQ coupling pads, the third CA coupling pads, and the fourth CA coupling pads are electrically connected to the second and fourth memory chips, and
when viewed in a plan view,
the first DQ coupling pads, the second DQ coupling pads, and the first CA coupling pads are adjacent to the first memory data pads, the second memory data pads, and the first memory command/address pads, respectively, of the first memory chip,
the third DQ coupling pads, the fourth DQ coupling pads, and the second CA coupling pads are adjacent to the third memory data pads, the fourth memory data pads, and the second memory command/address pads, respectively, of the first memory chip,
the fifth DQ coupling pads, the sixth DQ coupling pads, and the third CA coupling pads are adjacent to the first memory data pads, the second memory data pads, and the first memory command/address pads, respectively, of the second memory chip, and
the seventh DQ coupling pads, the eighth DQ coupling pads, and the fourth CA coupling pads are adjacent to the third memory data pads, the fourth memory data pads, and the second memory command/address pads, respectively, of the second memory chip.

10. The semiconductor package of claim 9, wherein
the logic chip includes first to eighth data pads, and first to fourth command/address pads,
the first to the fourth data pads, the first command/address pads, and the second command/address pads are electrically connected to the first and third memory chips; and
the fifth to the eighth data pads, the third command/address pads, and the fourth command/address pads are electrically connected to the second and fourth memory chips,
the first to eighth data pads are adjacent to the first to eighth DQ coupling pads, respectively, and
the first to fourth command/address pads are adjacent to the first to fourth CA coupling pads, respectively.

11. The semiconductor package of claim 9, wherein
the logic chip includes first to eighth data pads, first to fourth command/address pads, and first to fourth side surfaces,
the first to fourth data pads, the first command/address pads, and the second command/address pads are connected to the first and third memory chips,
the fifth to eighth data pads, the third command/address pads, and the fourth command/address pads are connected to the second and fourth memory chips,
the first and the second side surfaces of the logic chip are adjacent to each other,
the third and the fourth side surfaces of the logic chip face the first and second side surfaces, respectively, of the logic chip,
the first data pads, the second data pads, and the first command/address pads are adjacent to the first side surface of the logic chip,
the third data pads, the fourth data pads, and the second command/address pads are adjacent to the second side surface of the logic chip,
the fifth data pads, the sixth data pads, and the third command/address pads are adjacent to the third side surface of the logic chip, and
the seventh data pads, the eighth data pads, and the fourth command/address pads are adjacent to the fourth side surface of the logic chip.

12. The semiconductor package of claim 1, further comprising:
wires, wherein
each of the first and second jumper chips include first and second wire bonding pads spaced apart from each other in the second direction,
the first and second wire bonding pads are arranged along the first direction, and
the first wire bonding pads are connected to the third and fourth memory chips through the wires.

13. The semiconductor package of claim 1, wherein a memory capacity of each of the first and second memory chips is twice a memory capacity of each of the third and fourth memory chips.

14. A semiconductor package, comprising:
a package substrate;
a logic chip on the package substrate;
first and second memory chips on the package substrate, the first and second memory chips electrically connected to the logic chip, the first and second memory chips spaced apart from the logic chip in a first direction, the first and second memory chips spaced apart from each other in a second direction crossing the first direction;
third and fourth memory chips on the first and second semiconductor chips, respectively, the third and fourth memory chips electrically connected to the logic chip, a memory capacity of the first and second memory chips being twice a memory capacity of the third and fourth memory chips; and
first and second jumper chips on the first and second semiconductor chips, respectively, the first and second jumper chips spaced apart from the third and fourth memory chips, respectively, in the first direction.

15. The semiconductor package of claim 14, further comprising:
wires, wherein
the logic chip includes first to fourth data pads, first command/address pads, and second command/address pads along one side surface of the logic chip,
the first command/address pads are between the first and second data pads,
the second command/address pads are between the third and fourth data pads,
each of the first to fourth memory chips includes memory data pads and memory command/address pads spaced apart from each other in the first direction, the memory data pads are arranged along and adjacent to the one side surface of the logic chip, each of the first and second jumper chips includes first wire bonding pads and second wire bonding pads spaced apart from each other in the first direction, and the first and second wire bonding pads are arranged parallel to the memory data pads, and the first wire bonding pads are connected to the third and fourth memory chips through the wires.

16. A semiconductor package, comprising:

a first substrate;

a logic chip on the first substrate, the logic chip including a first number of data pads and a second number of communication pads;

a second substrate on the logic chip;

first memory chips spaced apart from each other in a first direction on the second substrate, the first memory chips including a first quantity of first memory data pads and a second quantity of first memory command/address pads, which are electrically connected to the logic chip;

second memory chips on the first memory chips, the second memory chips including a third of quantity of second memory data pads and a fourth quantity of second memory command/address pads, which are electrically connected to the logic chip; and jumper chips on the first memory chips, the jumper chips spaced apart from the second memory chips in a second direction crossing the first direction, the jumper chips including a fifth quantity of first wire bond pads and second wire bond pads, respectively, which are electrically connected to the logic chip.

17. The semiconductor package of claim 16, wherein a number of the first memory chips equals a number of the second memory chips, a number of the jumper chips equals the number of first memory chips, and a memory capacity of the first memory chips is greater than a memory capacity of the second memory chips.

18. The semiconductor package of claim 16, wherein the data pads and the communication pads in the logic chip are not on a same side of the logic chip.

19. The semiconductor package of claim 16, wherein a portion of the data pads and a portion of the communication pads in the logic chip are arranged on at least one same side of the logic chip.

20. The semiconductor package of claim 16, wherein the first memory data pads and the first memory command/address pads are not on a same side of the first memory chips, and the second memory data pads and the second memory command/address pads are not on a same side of the second memory chips.

* * * * *